United States Patent
Yang et al.

(10) Patent No.: US 11,574,857 B2
(45) Date of Patent: Feb. 7, 2023

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Ching-Feng Yang, Taipei (TW); Hsin-Yu Pan, Taipei (TW); Kai-Chiang Wu, Hsinchu (TW); Chien-Chang Lin, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 88 days.

(21) Appl. No.: 16/827,595

(22) Filed: Mar. 23, 2020

(65) Prior Publication Data

US 2021/0296221 A1 Sep. 23, 2021

(51) Int. Cl.
*H01L 23/498* (2006.01)
*H01L 21/52* (2006.01)
*H01L 23/16* (2006.01)
*H01L 21/48* (2006.01)
*H01L 25/18* (2006.01)

(52) U.S. Cl.
CPC .... *H01L 23/49822* (2013.01); *H01L 21/4857* (2013.01); *H01L 21/52* (2013.01); *H01L 23/16* (2013.01); *H01L 23/49833* (2013.01); *H01L 23/49838* (2013.01); *H01L 25/18* (2013.01)

(58) Field of Classification Search
None
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1* | 10/2016 | Tsai | H01L 21/78 |
| 9,496,189 B2 | 11/2016 | Yu et al. | |
| 9,666,502 B2 | 5/2017 | Chen et al. | |
| 9,735,131 B2 | 8/2017 | Su et al. | |

(Continued)

OTHER PUBLICATIONS

Jiun-Yi Wu et al., "Semiconductor Packages and Methods of Manufacturing the Same", Unpublished U.S. Appl. No. 16/521,601, filed Jul. 25, 2019.

*Primary Examiner* — Alexander G Ghyka
(74) *Attorney, Agent, or Firm* — JCIPRNET

(57) ABSTRACT

A semiconductor package includes a circuit board structure, a redistribution layer structure, a package structure, and a ring structure. The redistribution layer structure has a first region and a second region surrounding the first region. The redistribution layer structure is disposed over and electrically connected to the circuit board structure. A metal density in the second region is greater than a metal density in the first region. The package structure is disposed over the first region of the redistribution layer structure. The package structure is electrically connected to the redistribution layer structure. The ring structure is disposed over the second region of the redistribution layer structure.

20 Claims, 18 Drawing Sheets

(56) References Cited

U.S. PATENT DOCUMENTS

| | | | |
|---|---|---|---|
| 2015/0118797 A1* | 4/2015 | Liu | H01L 21/561 |
| | | | 438/114 |
| 2015/0214128 A1* | 7/2015 | Lin | H01L 23/585 |
| | | | 438/118 |
| 2015/0262900 A1* | 9/2015 | Wang | H01L 21/563 |
| | | | 257/704 |
| 2017/0125347 A1* | 5/2017 | Hu | H01L 24/02 |
| 2017/0186707 A1* | 6/2017 | Brun | H01L 21/76898 |
| 2017/0287845 A1* | 10/2017 | Huang | H01L 25/105 |

* cited by examiner

SEMICONDUCTOR PACKAGE AND MANUFACTURING METHOD THEREOF

BACKGROUND

Semiconductor packages are used in a variety of electronic applications, such as personal computers, cell phones, digital cameras, and other electronic equipment. In terms of the packaging used for integrated circuit components or semiconductor dies, one or more chip packages are generally bonded to a circuit carrier (e.g., a system board, a printed circuit board, or the like) for electrical connections to other external devices or electronic components.

Recently, high-performance computing (HPC) has become more popular and being widely used in advanced networking and server applications, especially for AI (artificial intelligence) related products that require high data rate, increasing bandwidth and for lowering latency. However, as the package size is getting larger for packages including the HPC component, more challenging issue occur.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
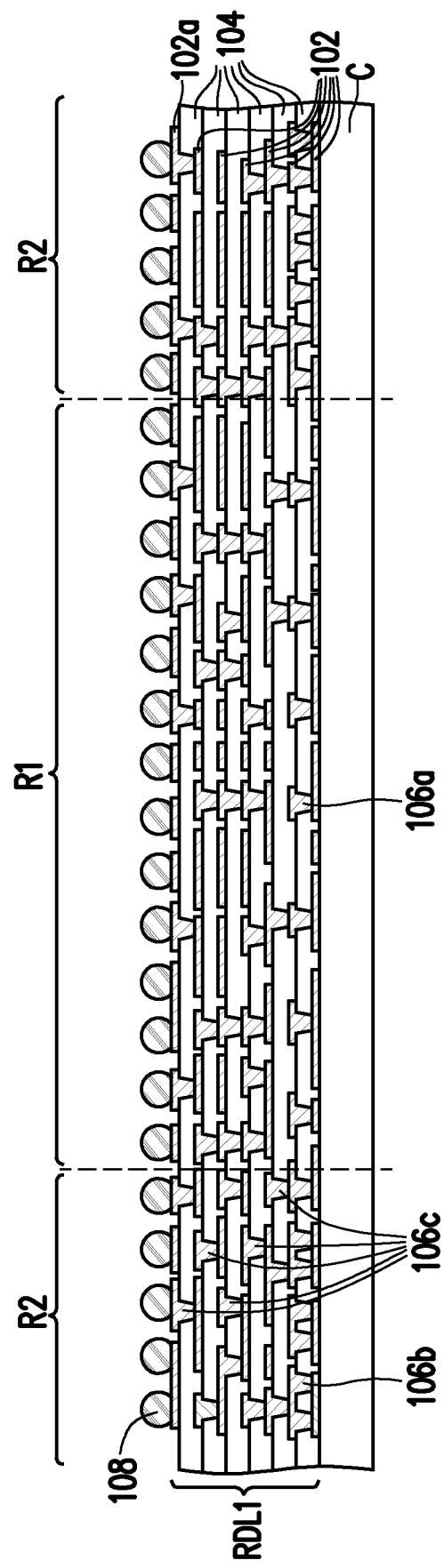
FIG. 1A to FIG. 1J are schematic cross-sectional views illustrating a manufacturing process of a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1J are schematic cross-sectional views illustrating a manufacturing process of a semiconductor package 10 in accordance with some embodiments of the disclosure. Referring to FIG. 1A, a redistribution layer structure RDL1 is formed over a carrier C. In some embodiments, the carrier C may be a glass carrier or any suitable carrier for carrying a semiconductor wafer or a reconstituted wafer for the manufacturing method of the semiconductor package 10. A shape of the carrier C may be circular, rectangular, or other suitable shapes.

In some embodiments, the redistribution layer structure RDL1 may be a fan-out redistribution layer structure. In some embodiments, the method of forming the redistribution layer structure RDL1 may include the following steps. First, a seed material layer (not shown) is blanketly formed over the carrier C. In some embodiments, the seed material layer includes a titanium/copper composite layer and is formed by a sputtering process. Then, a mask pattern (not shown) having openings is formed on the seed material layer. The openings of the mask pattern expose the intended location for the subsequently formed conductive patterns 102 (the bottommost conductive patterns 102 shown in FIG. 1A). Afterwards, a plating process is performed to form a conductive material layer on the seed material layer exposed by the openings of the mask pattern. In some embodiments, a material of the conductive material layer includes aluminum, titanium, copper, nickel, tungsten, and/or alloys thereof. The mask pattern and the underlying seed material layer are then removed by a stripping process and an etching process. The remaining seed material layer and the remaining conductive material layer then constitute the bottommost conductive patterns 102 shown in FIG. 1A. After the bottommost conductive patterns 102 are formed, a dielectric layer 104 (the bottommost dielectric layer 104 shown in FIG. 1A) is formed on the carrier C to cover the conductive patterns 102. In other words, the conductive patterns 102 are embedded in the dielectric layer 104. In some embodiments, a material of the dielectric layers 104 may be molding compound, polymer such as polyimide, polybenzoxazole (PBO) or benzocyclobutene (BCB), nitride such as silicon nitride, oxide such as silicon oxide, phosphosilicate glass (PSG), borosilicate glass (BSG), boron-doped phosphosilicate glass (BPSG), a combination thereof or the like. In some embodiments, a thickness of the dielectric layer 104 is in a range of about 5 µm to about 50 µm. The dielectric layer 104, for example, may be formed by suitable fabrication techniques such as spin-on coating, chemical vapor deposition (CVD), plasma-enhanced chemical vapor deposition (PECVD), or the like. Thereafter, a plurality of contact openings (not shown) is formed in the dielectric layer 104 to expose at least a portion of each conductive pattern 102. In some embodiments, the contact openings may be formed by a photolithography process and an etching process. Subsequently, the step of forming the seed material layer and the conductive material layer presented above may be repeated to render the conductive patterns 102 and the conductive vias 106a, 106b located above the bottommost conductive patterns 102. That is, the conductive vias 106a, 106b are embedded in the bottommost dielectric layer 104, as shown in FIG. 1A. The foregoing steps may be repeated several times to obtain the redistribution layer structure RDL1 having multiple layers (i.e. forming the conductive patterns 102, 102a, the dielectric layers 104, and the conductive vias 106c located above the bottommost dielectric layer 104 and the conductive vias 106a, 106b).

As illustrated in FIG. 1A, the conductive patterns 102, 102a and the dielectric layers 104 are alternately stacked over the carrier C. On the other hand, the conductive patterns 102 located at different level heights are connected to each other through the conductive vias 106a, 106b, and 106c. In some embodiments, the conductive patterns 102a and the topmost conductive patterns 102 are connected to each other through the topmost conductive vias 106c. In some embodiments, the conductive patterns 102a are used as conductive terminals, which may include a plurality of conductive pillars and a plurality of under-ball metallurgy (UBM) patterns therebeneath for ball mount. In some embodiments, the conductive patterns 102a may be bonding pads. In some embodiments, the dielectric layers 104 made of molding compound and the dielectric layers 104 made of polymer (which is not molding compound) may be alternately disposed. For example, the bottommost dielectric layer 104 is made of molding compound, and the topmost dielectric layer 104 is made of polymer (which is not molding compound). However, the disclosure is not limited thereto. In some alternative embodiments, the dielectric layers 104 may be made of the same material.

As illustrated in FIG. 1A, the redistribution layer structure RDL1 has a first region R1 and a second region R2 surrounding the first region R1. In some embodiments, the conductive vias 106a are located in the first region R1 while the conductive vias 106b are located in the second region R2. In some embodiments, the conductive vias 106a are able to transmit signals. On the other hand, the conductive vias 106b are electrically floating and are unable to transmit signals. For example, the conductive vias 106b are electrically isolated from other components in the subsequently formed semiconductor package 10. However, the disclosure is not limited thereto. In some alternative embodiments, the conductive vias 106b are also electrically connected to other elements in the semiconductor package 10 to transmit signals. In some embodiments, a metal density in the second region R2 of the redistribution layer structure RDL1 is greater than a metal density in the first region R1 of the redistribution layer structure RDL1. Throughout the disclosure, the metal density is referred to as a volume of metal material within a unit volume. For example, within the same volume, the amount of metal material in the first region R1 is greater than the amount of metal material in the second region R2. In some embodiments, the foregoing metal density relationship may be achieved by adjusting the pattern densities of the conductive vias 106a and the conductive vias 106b in the redistribution layer structure RDL1. For example, a pattern density of the conductive vias 106b located in the second region R2 is adjusted to be greater than a pattern density of the conductive vias 106a located in the first region R1. In some embodiments, a ratio of the pattern density of the conductive vias 106b to the pattern density of the conductive vias 106a ranges from about 6:1 to about 19:1. The configurations of the conductive vias 106a and the conductive vias 106b will be discussed below in conjunction with FIG. 2A.

Figure 2A:
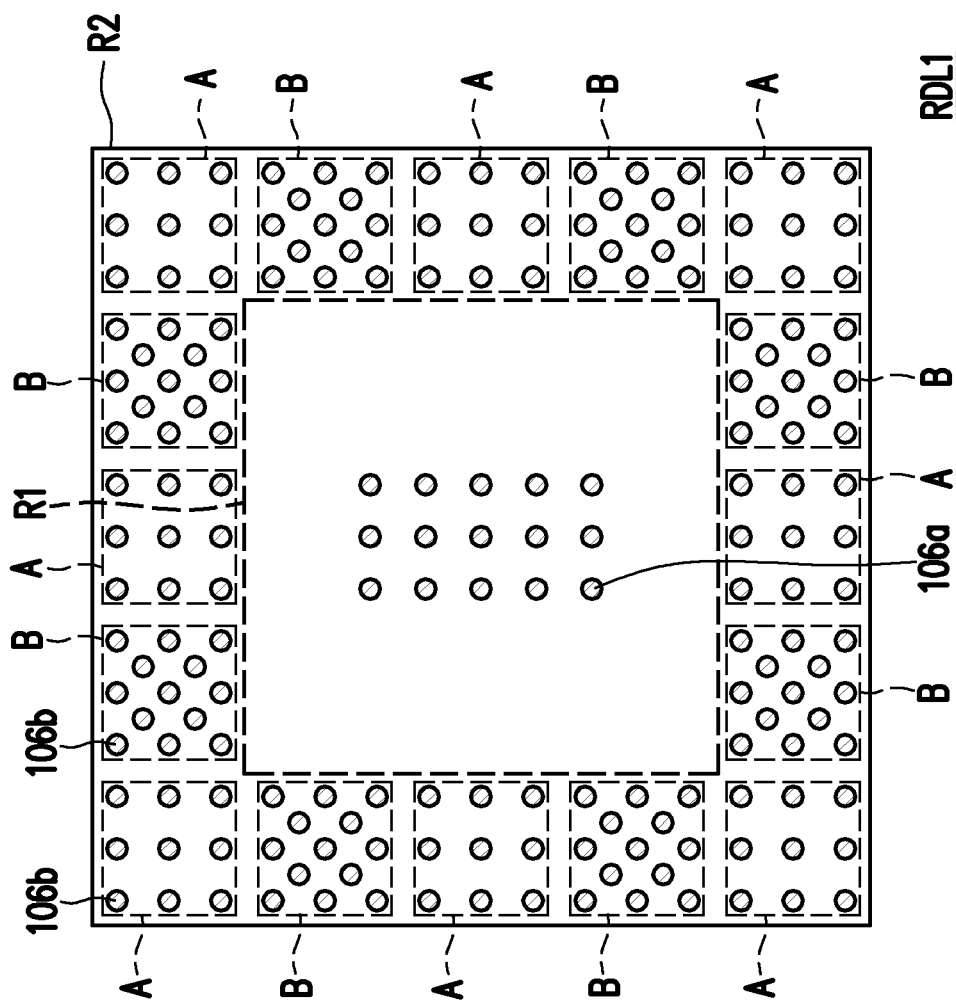
FIG. 2A is a bottom view of the redistribution layer structure in FIG. 1A.

FIG. 2A is a bottom view of the redistribution layer structure RDL1 in FIG. 1A. For simplicity, the conductive patterns 102 are omitted in FIG. 2A. It should be noted that FIG. 2A has taken a square as an example for the shape of the redistribution layer structure RDL1, but the disclosure is not limited thereto. In some alternative embodiments, the shape of the redistribution layer structure RDL1 may be circular, rectangular, or other suitable shapes. Referring to FIG. 1A and FIG. 2A, the first region R1 is enclosed by the second region R2, and the conductive vias 106b surround the conductive vias 106a. In some embodiments, a pattern density (i.e. the global pattern density) of the conductive vias 106b located in the second region R2 is greater than a pattern density of the conductive vias 106a located in the first region R1. Throughout the disclosure, the pattern density is referred to as a percentage of a unit area occupied by conductive vias from a top view. For example, within the same area, the number of the conductive vias 106b is greater than the number of the conductive vias 106a.

As illustrated in FIG. 2A, the pattern density of the conductive vias 106b located in the second region R2 is not uniform. For example, within the second region R2, the conductive vias 106b may have various local pattern densities different from one another in different sub-regions. That is, the conductive vias 106b may have at least two different local pattern densities within the second region R2. For example, as illustrated in FIG. 2A, the second region R2 has first sub-regions A and second sub-regions B. In some embodiments, each second sub-region B is located between two adjacent first sub-regions A. In some embodiments, the number of the conductive vias 106b located in each second sub-region B is greater than the number of the conductive vias 106b located in each first sub-region A. That is, a pattern density (i.e. the local pattern density) of the conductive vias 106b located in the second sub-region B is greater than a pattern density (i.e. the local pattern density) of the conductive vias 106b located in the first sub-region A. On the other hand, as illustrated in FIG. 2A, the pattern density of the conductive vias 106b located in the first sub-region A is equal to the pattern density of the conductive vias 106a located in the first region R1. However, the disclosure is not limited thereto. In some alternative embodiments, the pattern density of the conductive vias 106b located in the first sub-region A may be greater or less than the pattern density of the conductive vias 106a located in the first region R1. In other words, the local pattern density of the conductive vias 106b located in the first sub-region A may be adjusted as long as the global pattern density of the conductive vias 106b located in the second region R2 is greater than the pattern density of the conductive vias 106a located in the first region R1. In some embodiments, the global pattern density of the conductive vias 106b located in the second region R2 is approximately 1.6% and the pattern density of the conductive vias 106a located in the first region R1 is approximately 0.27%. In other words, a ratio of the pattern density of the conductive vias 106b to the pattern density of the conductive vias 106a is about 6:1.

In some embodiments, since the global pattern density of the conductive vias 106b located in the second region R2 is greater than the pattern density of the conductive vias 106a located in the first region R1, the metal density in the second region R2 of the redistribution layer structure RDL1 is greater than the metal density in the first region R1 of the redistribution layer structure RDL1.

It should be noted that the configuration shown in FIG. 2A is merely an example for adjusting the pattern density of the conductive vias to render the metal density in the second region R2 of the redistribution layer structure RDL1 to be greater than the metal density in the first region R1 of the redistribution layer structure RDL1, and the disclosure is not limited thereto. Other configurations of the conductive vias 106a, 106b may also be adapted to render the metal density relationship in the first region R1 and the second region R2, and these configurations will be discussed below in conjunction with FIG. 2B to FIG. 2F.

Figure 2B:
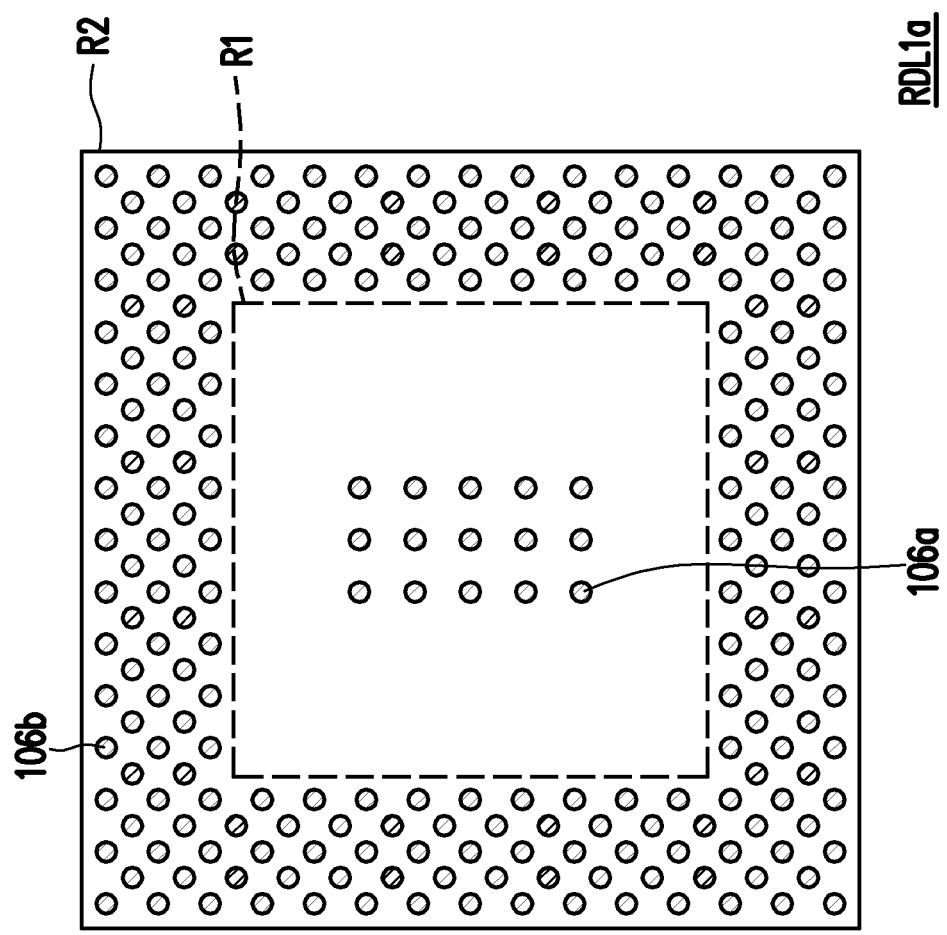
FIG. 2B is a bottom view of the redistribution layer structure in accordance with some alternative embodiments of the disclosure.

FIG. 2B is a bottom view of the redistribution layer structure RDL1a in accordance with some alternative embodiments of the disclosure. Referring to FIG. 2B, the redistribution layer structure RDL1a in FIG. 2B is similar to the redistribution layer structure RDL1 in FIG. 2A, so similar elements are denoted by the same reference numeral, and the detailed descriptions thereof are omitted herein. The difference between the redistribution layer structure RDL1a in FIG. 2B and the redistribution layer structure RDL1 in FIG. 2A lies in that the pattern density of the conductive vias 106b located in the second region R2 is uniform in the redistribution layer structure RDL1a. As illustrated in FIG. 2B, a pattern density of the conductive vias 106b located in the second region R2 is greater than a pattern density of the conductive vias 106a located in the first region R1. In some embodiments, the pattern density of the conductive vias 106b located in the second region R2 is approximately 5% and the pattern density of the conductive vias 106a located in the first region R1 is approximately 0.27%. In other words, a ratio of the pattern density of the conductive vias 106b to the pattern density of the conductive vias 106a is about 19:1.

In some embodiments, since the pattern density of the conductive vias 106b located in the second region R2 is greater than the pattern density of the conductive vias 106a located in the first region R1, the metal density in the second region R2 of the redistribution layer structure RDL1a is greater than the metal density in the first region R1 of the redistribution layer structure RDL1a.

Figure 2C:
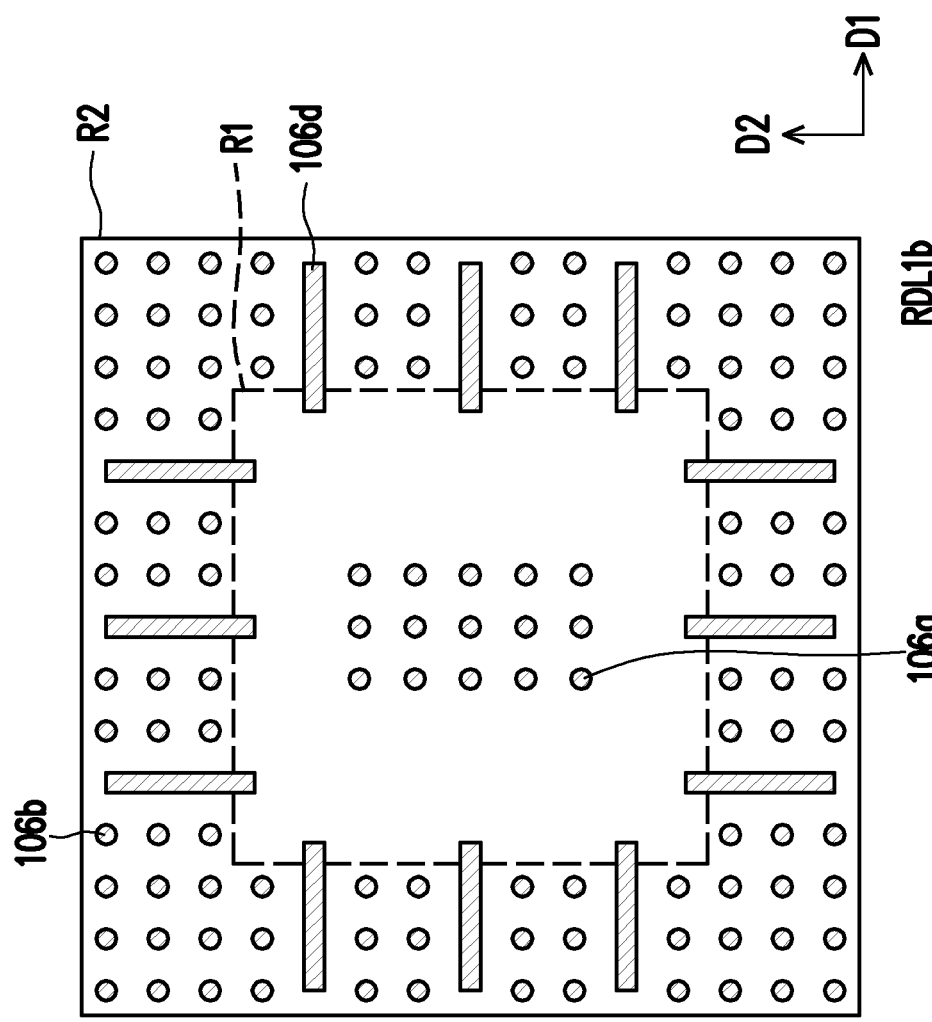
FIG. 2C is a bottom view of the redistribution layer structure in accordance with some alternative embodiments of the disclosure.

FIG. 2C is a bottom view of the redistribution layer structure RDL1b in accordance with some alternative embodiments of the disclosure. Referring to FIG. 2C, the redistribution layer structure RDL1b in FIG. 2C is similar to the redistribution layer structure RDL1 in FIG. 2A, so similar elements are denoted by the same reference numeral, and the detailed descriptions thereof are omitted herein. The difference between the redistribution layer structure RDL1b in FIG. 2C and the redistribution layer structure RDL1 in FIG. 2A lies in that the pattern density of the conductive vias 106b located in the second region R2 and the pattern density of the conductive vias 106a located in the first region R1 are the substantially the same in the redistribution layer structure RDL1b. However, some of the conductive vias 106b located in the second region R2 are replaced by a plurality of wall structures 106d. That is, the wall structures 106d are formed in the second region R2. In some embodiments, the wall structures 106d are made of the same material as the conductive vias 106a, 106b. In some embodiments, the wall structures 106d and the conductive vias 106a, 106b are simultaneously formed. That is, the wall structures 106d and the conductive vias 106a, 106b are located at the same level height and are embedded in the same dielectric layer. For example, the wall structures 106d are also embedded in the bottommost dielectric layer 104 of the redistribution layer structure RDL1 shown in FIG. 1A. In some embodiments, unlike the conductive vias 106a, 106b having a circular top view, each wall structure 106d is strip-like from the top view.

In some embodiments, some of the wall structures 106d extend along a first direction D1 and the rest of the wall structures 106d extend along a second direction D2 perpendicular to the first direction D1. In some embodiments, the first direction D1 is parallel to two edges of the redistribution layer structure RDL1b while the second direction D2 is parallel to another two edges of the redistribution layer structure RDL1b. That is, the extending directions of the wall structures 106d are parallel to the edges of the redistribution layer structure RDL1b. As illustrated in FIG. 2C, the wall structures 106d extend from the second region R2 to the first region R1. In other words, the wall structures 106d may cross the boundary between the first region R1 and the second region R2. Nevertheless, the majority of each wall structure 106d is still located in the second region R2. However, the disclosure is not limited thereto. In some alternative embodiments, the wall structures 106d do not cross the boundary between the first region R1 and the second region R2. In other words, the wall structures 106d may be completely located in the second region R2.

In some embodiments, the wall structures 106d are electrically floating and are unable to transmit signals. For example, the wall structures 106d are electrically isolated from other components in the subsequently formed semiconductor package 10. However, the disclosure is not limited thereto. In some alternative embodiments, the wall structures 106d are also electrically connected to other elements in the semiconductor package 10 to transmit signals.

Although the pattern density of the conductive vias 106b located in the second region R2 and the pattern density of the conductive vias 106a located in the first region R1 are substantially the same, with the addition of the wall structures 106d, the metal density in the second region R2 of the redistribution layer structure RDL1b is greater than the metal density in the first region R1 of the redistribution layer structure RDL1b.

Figure 2D:
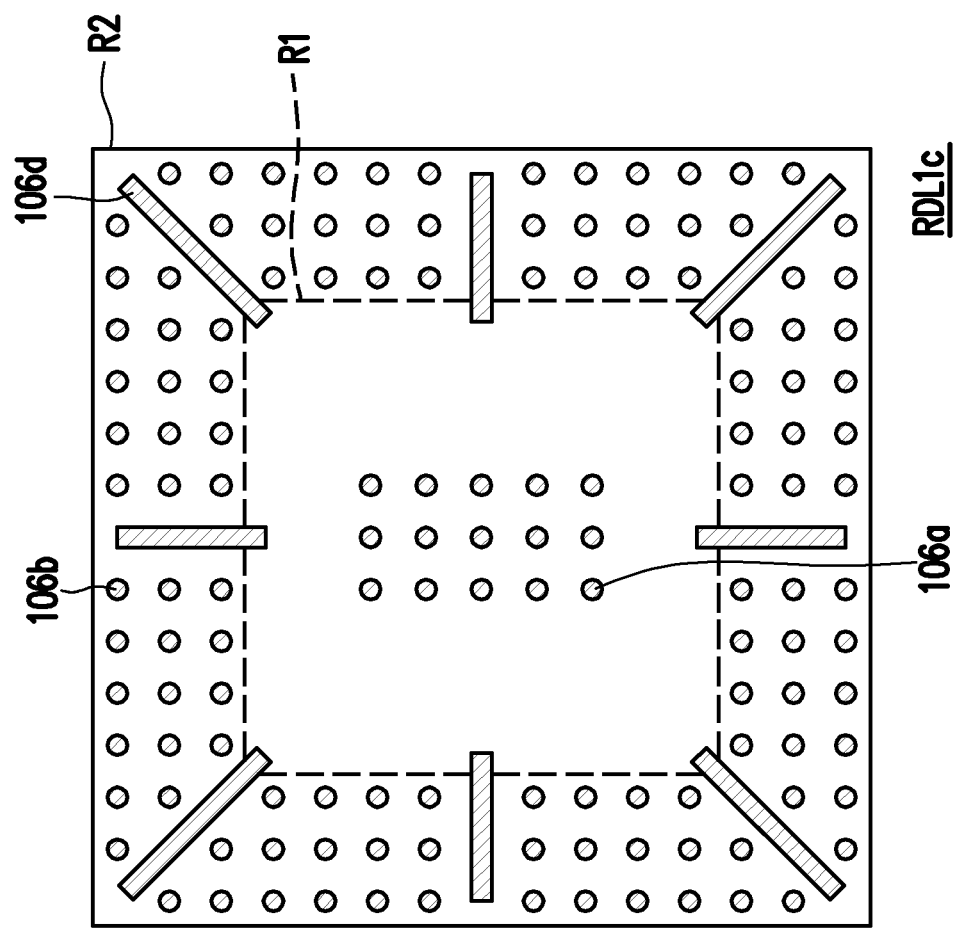
FIG. 2D is a bottom view of the redistribution layer structure in accordance with some alternative embodiments of the disclosure.

FIG. 2D is a bottom view of the redistribution layer structure RDL1c in accordance with some alternative embodiments of the disclosure. Referring to FIG. 2D, the redistribution layer structure RDL1c in FIG. 2D is similar to the redistribution layer structure RDL1b in FIG. 2C, so similar elements are denoted by the same reference numeral, and the detailed descriptions thereof are omitted herein. The difference between the redistribution layer structure RDL1c in FIG. 2D and the redistribution layer structure RDL1b in FIG. 2C lies in that the wall structures 106d in the redistribution layer structure RDL1c extend radially outward in the redistribution layer structure RDL1c. That is, the wall structures 106d extend along a direction from a center of the redistribution layer structure RDL1c toward edges of the redistribution layer structure RDL1c.

Although the pattern density of the conductive vias 106b located in the second region R2 and the pattern density of the conductive vias 106a located in the first region R1 are substantially the same, with the addition of the wall structures 106d, the metal density in the second region R2 of the redistribution layer structure RDL1c is greater than the metal density in the first region R1 of the redistribution layer structure RDL1c.

Figure 2E:
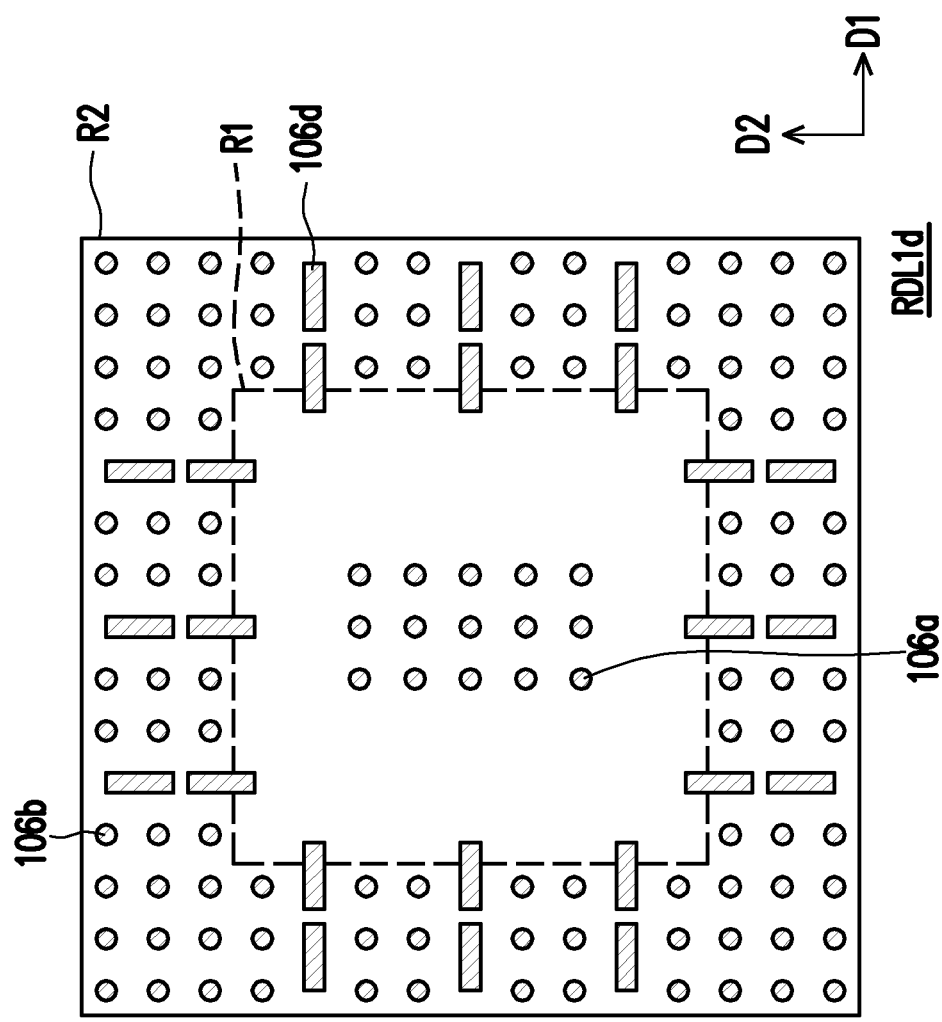
FIG. 2E is a bottom view of the redistribution layer structure in accordance with some alternative embodiments of the disclosure.

FIG. 2E is a bottom view of the redistribution layer structure RDL1d in accordance with some alternative embodiments of the disclosure. Referring to FIG. 2E, the redistribution layer structure RDL1d in FIG. 2E is similar to the redistribution layer structure RDL1b in FIG. 2C, so similar elements are denoted by the same reference numeral, and the detailed descriptions thereof are omitted herein. The difference between the redistribution layer structure RDL1d in FIG. 2E and the redistribution layer structure RDL1b in FIG. 2C lies in that each of the wall structures 106d in the redistribution layer structure RDL1d is a discontinuous pattern from a top view. That is, each wall structure 106d is divided into segments by the dielectric layer (i.e. the bottommost dielectric layer 104 shown in FIG. 1A) laterally wrapping around the wall structures 106d.

Although the pattern density of the conductive vias 106b located in the second region R2 and the pattern density of the conductive vias 106a located in the first region R1 are substantially the same, with the addition of the wall structures 106d, the metal density in the second region R2 of the redistribution layer structure RDL1d is greater than the metal density in the first region R1 of the redistribution layer structure RDL1d.

Figure 2F:
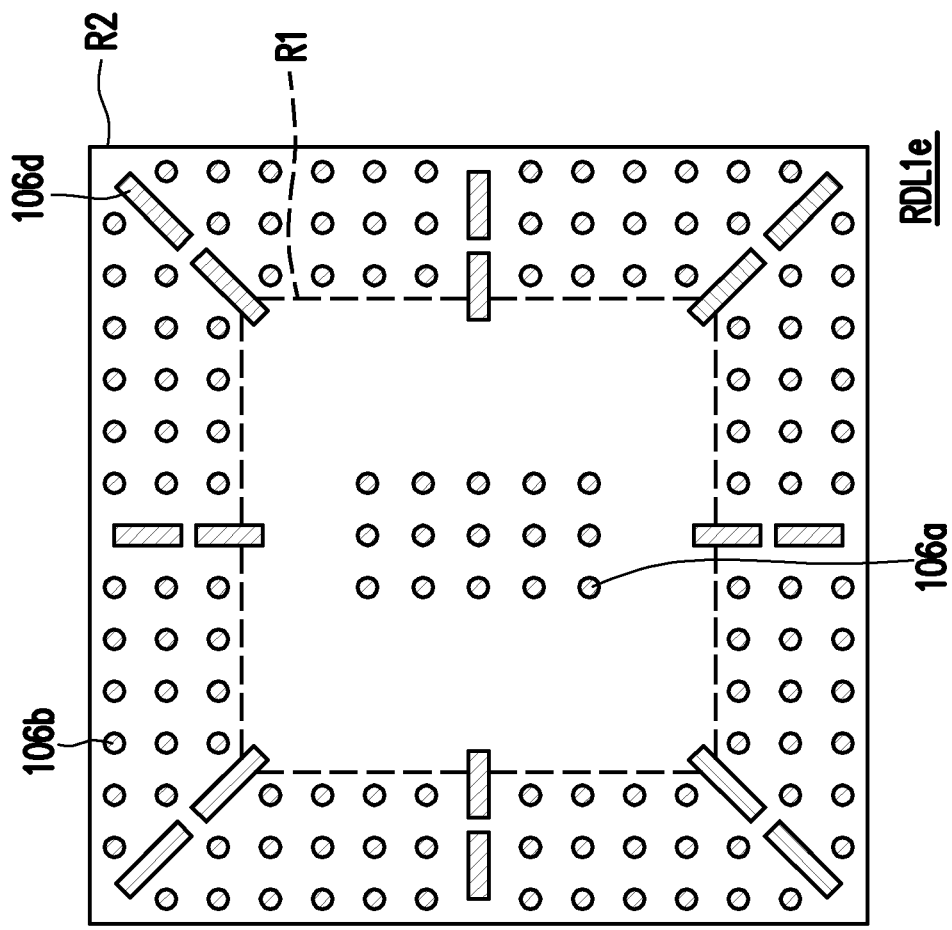
FIG. 2F is a bottom view of the redistribution layer structure in accordance with some alternative embodiments of the disclosure.

FIG. 2F is a bottom view of the redistribution layer structure RDL1e in accordance with some alternative embodiments of the disclosure. Referring to FIG. 2F, the redistribution layer structure RDL1e in FIG. 2F is similar to the redistribution layer structure RDL1c in FIG. 2D, so similar elements are denoted by the same reference numeral, and the detailed descriptions thereof are omitted herein. The difference between the redistribution layer structure RDL1e in FIG. 2F and the redistribution layer structure RDL1c in FIG. 2D lies in that each of the wall structures 106d in the redistribution layer structure RDL1e is a discontinuous pattern from a top view. That is, each wall structure 106d is divided into segments by the dielectric layer (i.e. the bottommost dielectric layer 104 shown in FIG. 1A) laterally wrapping around the wall structures 106d.

Although the pattern density of the conductive vias 106b located in the second region R2 and the pattern density of the conductive vias 106a located in the first region R1 are substantially the same, with the addition of the wall structures 106d, the metal density in the second region R2 of the redistribution layer structure RDL1e is greater than the metal density in the first region R1 of the redistribution layer structure RDL1e.

Referring to FIG. 1A again, after forming the redistribution layer structure RDL1, a plurality of bonding elements 108 is formed on the conductive patterns 102a. In some embodiments, the bonding elements 108 may be solder regions such as solder balls or ball grid array (BGA) connectors, metal pillars, and/or the like. The bonding elements 108 are electrically connected to the redistribution layer structure RDL1 through the conductive patterns 102a. In some embodiments, the bonding elements 108 may be formed by a mounting process and a reflow process. In some embodiments, a diameter of the bonding element 108 is in a range of 25 μm to 800 μm.

Figure 1B:
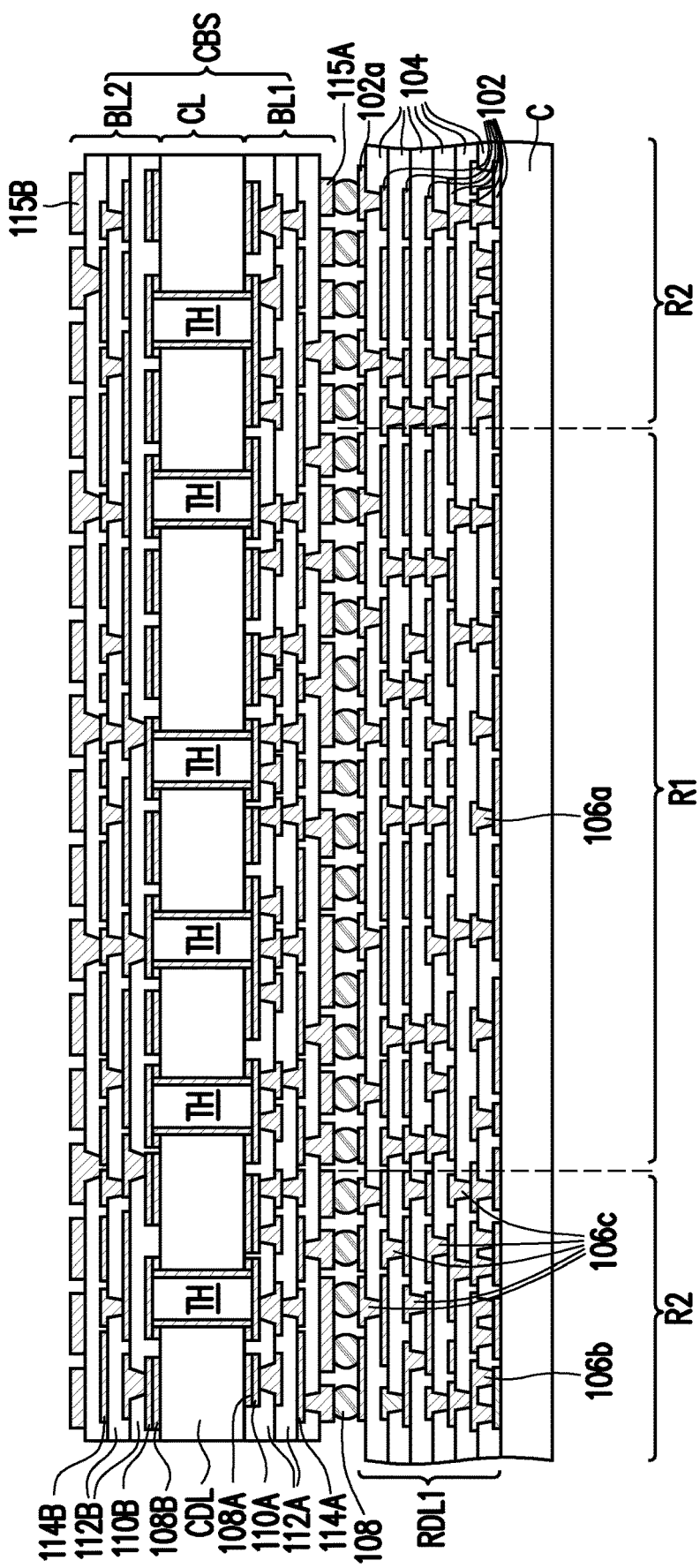

Referring to FIG. 1B, a circuit board structure CBS is bonded to the redistribution layer structure RDL1 through the bonding elements 108. Although one circuit board structure CBS is shown in FIG. 1B, the disclosure is not limited thereto. In some alternative embodiments, a plurality of circuit board structures CBS may be bonded onto the redistribution layer structure RDL1 at the same time. For example, the redistribution layer structure RDL1 may include a plurality of package regions, and the circuit board structures CBS are respectively bonded to the package regions. In some embodiments, the circuit board structure CBS includes a core layer CL and first and second build-up layers BL1, BL2 respectively located on two surfaces of the core layer CL. In some embodiments, the core layer CL includes a core dielectric layer CDL, core conductive layers 108A and 108B, conductive lids 110A and 110B, and plated through holes TH. In some embodiments, the core dielectric layer CDL includes prepreg (which contains epoxy, resin, silica filler and/or glass fiber), Ajinomoto Buildup Film (ABF), resin coated copper foil (RCC), polyimide, photo image dielectric (PID), ceramic core, glass core, molding compound, a combination thereof, or the like. However, the disclosure is not limited thereto, and other dielectric materials may also be used. The core dielectric layer CDL may be formed by a lamination process, a coating process, or the like. The core conductive layers 108A and 108B are formed on the opposite sides of the core dielectric layer CDL. In some embodiments, the core conductive layers 108A and 108B include copper, gold, tungsten, aluminum, silver, gold, a combination thereof, or the like. The conductive lids 110A and 110B are located respectively over the core conductive layers 108A and 108B. In some embodiments, the conductive lids 110A and 110B include copper or other suitable conductive material, for example.

In some embodiments, the plated through holes TH are disposed in and penetrate through the core dielectric layer CDL, which provide electrical connection between the core conductive layer 108A and the core conductive layer 108B. In other words, the plated through holes TH provide electrical paths between the electrical circuits located on two opposing sides of the core dielectric material layer CDL. In some embodiments, the plated through holes TH may be lined with a conductive material and filled up with an insulating material. In some embodiments, the method of forming the plated through holes TH includes the following operations. First, through holes (not shown) are formed at the predetermined positions by, for example, a mechanical or laser drilling, an etching, or another suitable removal technique. A desmear treatment may be performed to remove residues remaining in the through holes. Subsequently, the through holes may be plated with one or more conductive materials to a predetermined thickness, thereby providing the plated through holes TH. For example, the through holes may be plated with copper by an electroplating or an electroless plating.

In some embodiments, the core conductive layers 108A and 108B, the conductive lids 110A and 110B, and the plated through holes TH may be formed by the following steps. First, a first conductive material (not shown) is respectively formed on two opposite surfaces of the core dielectric layer CDL. Then, the plated through holes TH are formed to penetrate the core dielectric layer CDL as mentioned above and to provide electrical connection between the first conductive material respectively formed on both surfaces of the core dielectric layer CDL. Thereafter, a second conductive material is respectively formed over the first conductive materials on the opposite surfaces of the core dielectric layer CDL, where the second conductive material may be different from the first conductive material. In some embodiments, the first and second conductive materials may be formed by any suitable method (e.g., chemical vapor deposition (CVD) sputtering, printing, plating, or the like). Then, the first conductive materials and the second conductive materials may be patterned together to form the core conductive layers 108A, 108B and the conductive lids 110A, 110B respectively. In some embodiments, the first and second conductive materials may be partially removed using a photolithography and etching process or another suitable removal technique.

In some embodiments, the first and second build-up layers BL1 and BL2 are respectively disposed on the opposite sides of the core layer CL. Specifically, the first build-up layer BL1 is formed over the conductive lids 110A of the core layer CL, and the second build-up layer BL2 is formed over the conductive lids 110B of the core layer CL. In some embodiment, the formation of the first build-up layer BL1 may include sequentially forming a plurality of first dielectric layers 112A and a plurality of first conductive patterns 114A, 115A, where the first dielectric layers 112A and the first conductive patterns 114A, 115A are alternately stacked over the first surface of the core layer CL. Similarly, the formation of the second build-up layer BL2 may include sequentially forming a plurality of second dielectric layers 112B and a plurality of second conductive patterns 114B, 115B, where the second dielectric layers 112B and the second conductive patterns 114B, 115B are alternately stacked over the second surface of the core layer CL. In some embodiments, a material of the dielectric layers 112A, 112B may be ABF, prepreg, RCC, polyimide, PID, molding compound, a combination thereof, or the like. In some alternative embodiments, the core dielectric layer CDL and the first and second dielectric layers 112A, 112B may be made of the same material. For example, the material of the core dielectric layer CDL and the first and second dielectric layers 112A, 112B may be molding compound such as epoxy molding compound (EMC). The dielectric layers 112A, 112B may be formed by a lamination process, a coating process, or the like. Although three layers of conductive patterns and three layers of dielectric layers are illustrated for each of the first build-up layer BL1 and the second build-up layer BL2 in FIG. 1B, the disclosure is not limited thereto. In some alternative embodiments, the number of dielectric layers 112A, 112B and the number of the conductive patterns 114A, 114B, 115A, and 115B may be adjusted upon the design requirements. In some embodiments, a thickness of the core layer CL is in a range of 30 µm to 2000 µm. In some embodiments, a thickness of the dielectric layer 112A, 112B is in a range of 5 µm to 50 µm, and a thickness of the conductive pattern 114A, 114B, 115A, 115B is in a range of 2 µm to 50 µm. In some embodiments, a thickness of the outermost conductive patterns 115A, 115B may be larger than a thickness of inner conductive patterns 114A, 114B. In some embodiments, the total number of layers of the first build-up layer BL1 may sum up to a total of 0 to 8 layers for the conductive patterns and dielectric layers, and the total number of layers of the second build-up layer BL2 may sum up to a total of 0 to 8 layers for the conductive patterns and dielectric layers. In other words, in some alternative embodiments, at least one of the first build-up layer BL1 and the second build-up layer BL2 may be omitted. For example, the first build-up layer BL1 may be omitted, and the core layer CL may be bonded to the redistribution layer structure RDL1 through the bonding elements 108. In some embodiments, the number of layers in the first build-up layer BL1 is equal to the number of layers in the second build-up layer BL2. Alternatively, the total number of the first build-up layer BL1 and the second build-up layer BL2 may be different. In some embodiments, the total number of layers of the first build-up layer BL1 and the second build-up layer BL2 in the circuit board structure CBS is less than the total number of layers of the build-up layer in the conventional circuit board structure, which may be 28 to 36 layers. Therefore, the circuit board structure CBS may be also called a semi-finished circuit substrate or a semi-finished circuit carrier in some examples.

In some embodiments, the outermost conductive patterns 115A of the first build-up layer BL1 are bonded to the bonding elements 108, so that the circuit board structure CBS and the redistribution layer structure RDL1 are bonded. In some embodiments, a reflow process is performed to attach the circuit board structure CBS onto the bonding elements 108 over the redistribution layer structure RDL1. After bonding, the circuit board structure CBS is electrically connected to the redistribution layer structure RDL1 through the bonding elements 108.

Figure 1C:
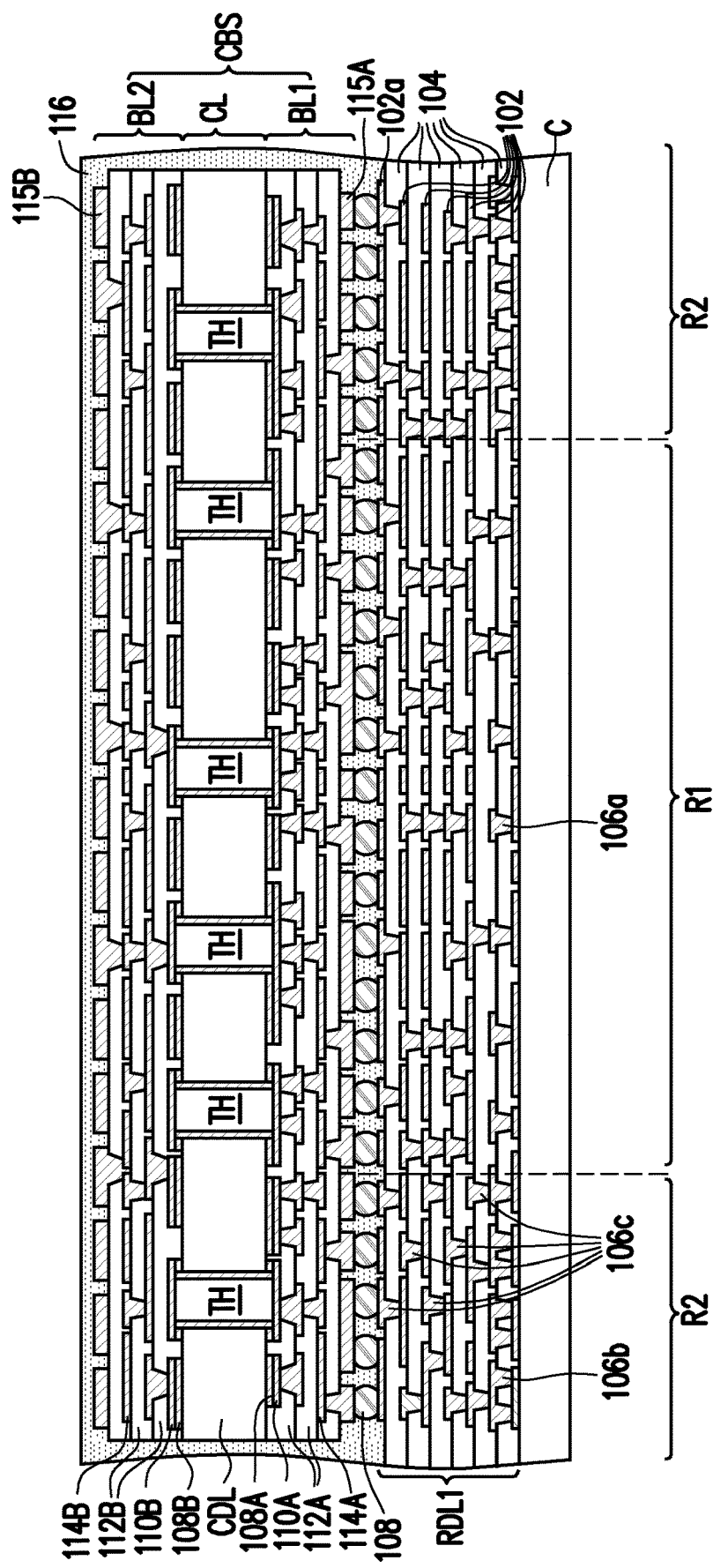

Referring to FIG. 1C, after the circuit board structure CBS and the redistribution layer structure RDL1 are bonded, an encapsulant 116 is formed over the carrier C to encapsulate the circuit board structure CBS. In some embodiments, the encapsulant 116 may be molding compound, molded underfill, polymer such as polyimide, polybenzoxazole (PBO) or benzocyclobutene (BCB), Ajinomoto Buildup Film (ABF) or other suitable encapsulating materials. In some embodiments, the encapsulant 116 may be formed by a molding process or other suitable methods. In some embodiment, the encapsulant 116 is formed by an over-molding process. As illustrated in FIG. 1C, the encapsulant 116 covers the outermost conductive patterns 115B of the second build-up layer BL2 and a sidewall of the circuit board structure CBS. In addition, the encapsulant 116 is formed between the outermost conductive patterns 115A of the first build-up layer BL1 and is formed aside the bonding elements 108 and the conductive patterns 102a. In other words, the circuit board structure CBS is embedded in the encapsulant 116 at this stage.

Figure 1D:
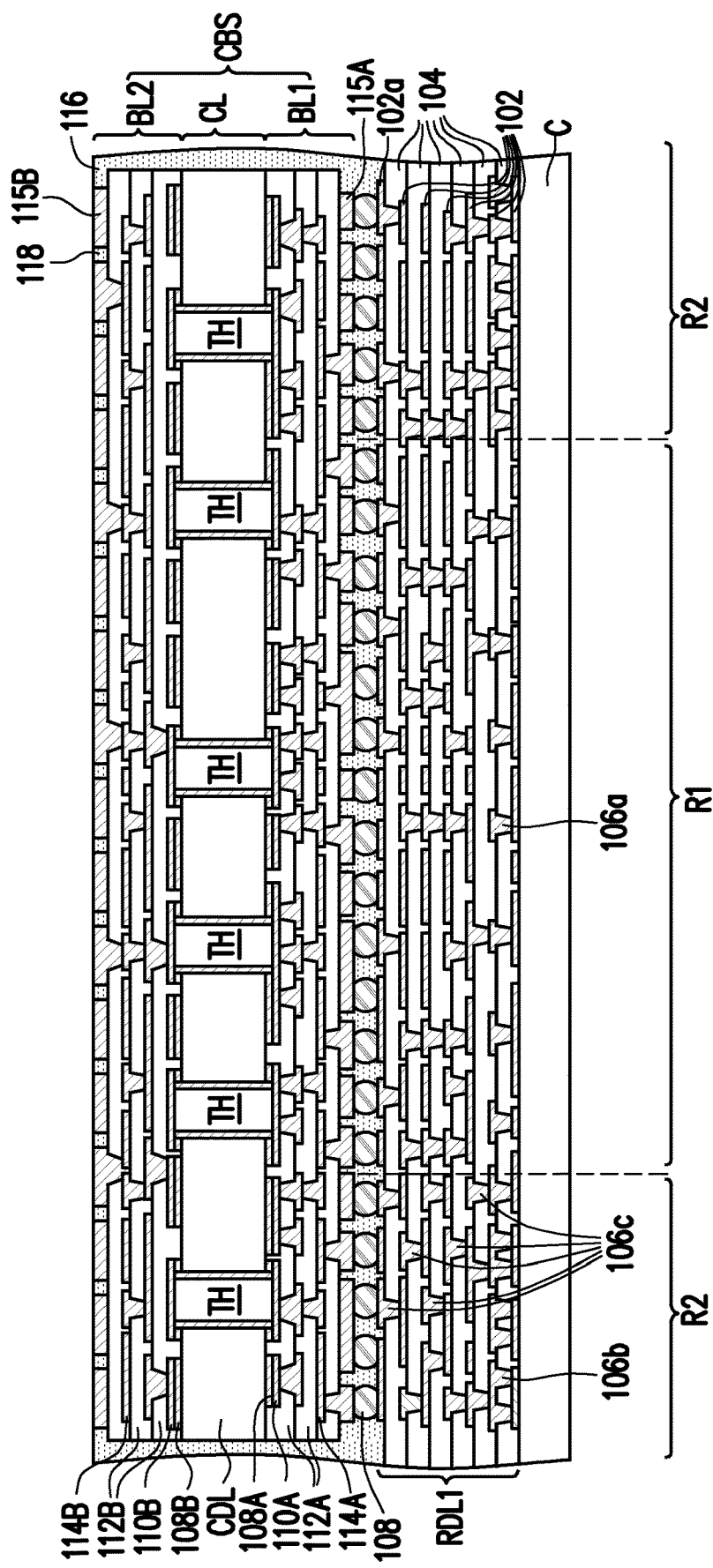

Referring to FIG. 1D, portions of the encapsulant 116 are removed, so as to expose the outermost conductive patterns 115B of the second build-up layer BL2 and form insulating patterns 118 between the outermost conductive patterns 115B. In some embodiments, top portions of the encapsulant 116 may be partially removed by a grinding process or a planarization process such as a chemical mechanical polishing process until the outermost conductive patterns 115B are exposed. In some embodiments, after grinding, a top surface of the remaining encapsulant 116 is substantially flush with a top surface of the circuit board structure CBS. That is, the top surfaces of the insulating patterns 118 are substantially coplanar with the top surfaces of the outermost conductive patterns 115B. Thus, the top surfaces of the outermost conductive patterns 115B are not covered by the insulating patterns 118. In some embodiments, sidewalls of the outermost conductive patterns 115B may be in contact with the insulating patterns 118. In some embodiments, the insulating patterns 118 may be insulating pillars. In some embodiments, a thickness of the insulating pattern 118 may be in a range of 7 µm to 80 µm, and a width of the insulating pattern 118 may be in a range of 5 µm to 5000 µm.

Figure 1E:
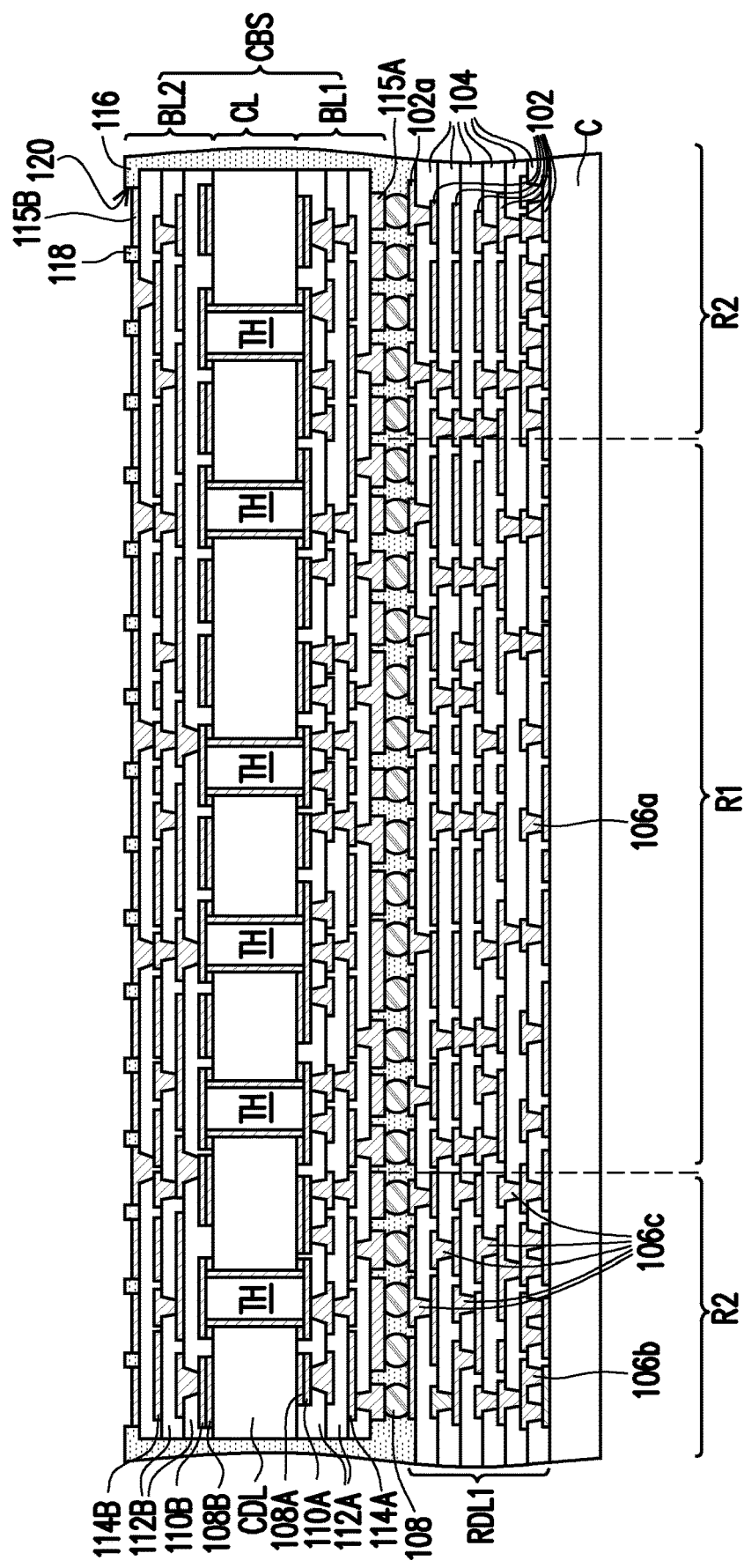

Referring to FIG. 1E, portions of the outermost conductive patterns 115B are removed, and the top surfaces of the outermost conductive patterns 115B are lower than the top surfaces of the insulating patterns 118. In some embodiments, the outermost conductive patterns 115B may be partially removed by an etching process such as a soft etching process. In addition, after the etching process, a surface treatment such as an organic solderability preservative (OSP) surface treatment may be performed on the top surfaces of the outermost conductive patterns 115B, for example. In some embodiments, after partially removed, a thickness of the outermost conductive pattern 115B may be in a range of 5 µm to 30 µm. As shown in FIG. 1E, openings 120 are formed between adjacent insulating patterns 118 to expose the outermost conductive patterns 115B therebetween. In some embodiments, the openings 120 may be also called housing spaces or a recesses for conductive terminals. In some embodiments, each opening 120 may have a depth (i.e., a height difference between the outermost conductive pattern 115B and the insulating pattern 118) in a range of 2 to 50 µm and a width in a range of 400 µm to 700 µm.

Figure 1F:
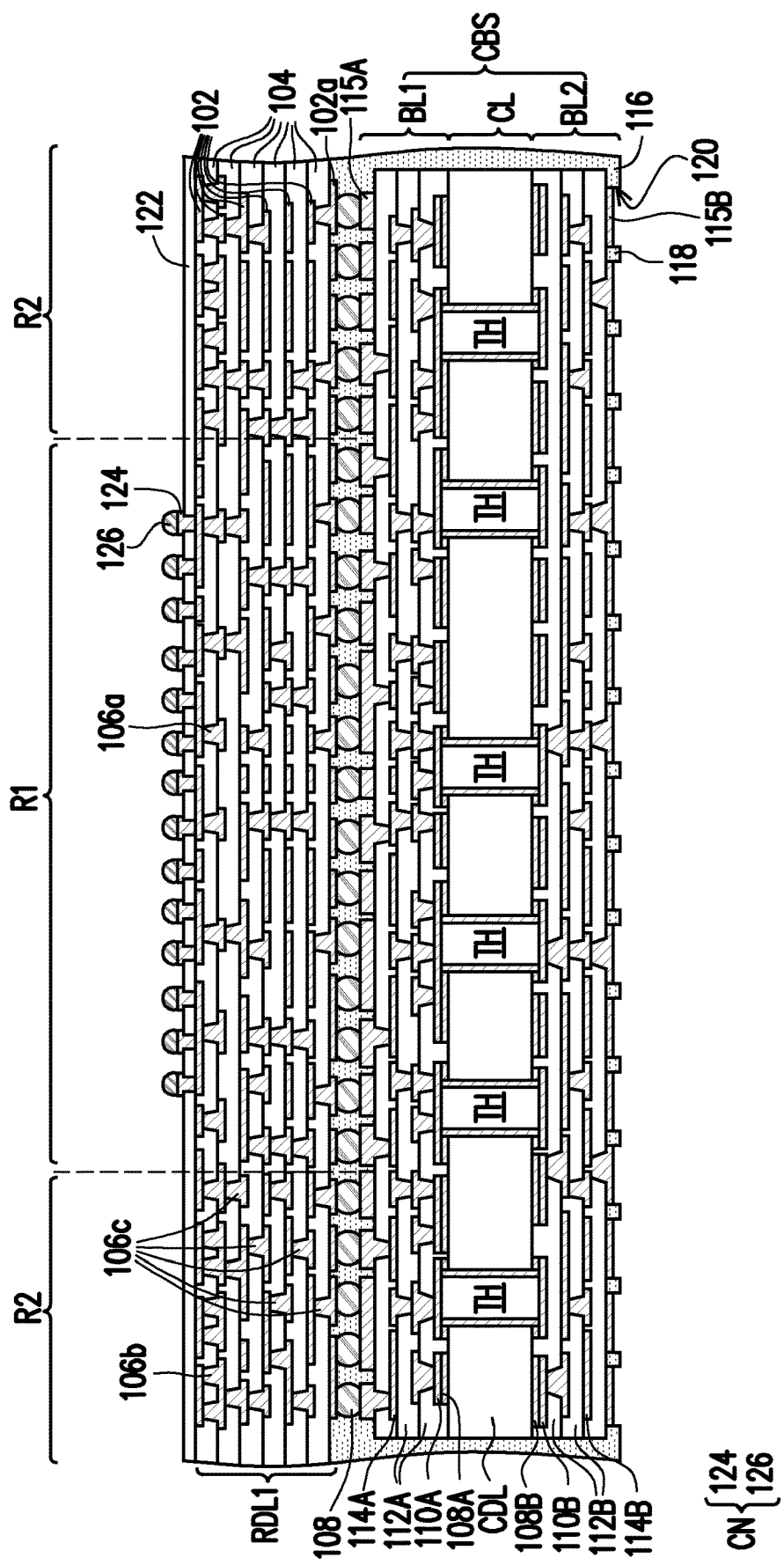

Referring to FIG. 1F, the redistribution layer structure RDL1 with the circuit board structure CBS thereon is de-bonded from the carrier C and is turned upside down. That is, the carrier C is removed. Then, a plurality of bonding elements 126 is formed over the first region R1 of the redistribution layer structure RDL1. In some embodiments, before forming the bonding elements 126, a passivation layer 122 is formed on the redistribution layer structure RDL1, and a plurality of conductive patterns 124 is formed in the passivation layer 122 to electrically connect the redistribution layer structure RDL1 and the bonding elements 126. In some embodiments, the passivation layer 122 is formed on and exposes the conductive patterns 102a of the redistribution layer structure RDL1. In some embodiments, a material of the passivation layer 122 may be polymer such as polyimide, polybenzoxazole (PBO) or benzocyclobutene (BCB), nitride such as silicon nitride, oxide such as silicon oxide, phosphosilicate glass (PSG), borosilicate glass (BSG), boron-doped phosphosilicate glass (BPSG), a combination thereof or the like. In some embodiments, the passivation layer 122 may be formed by suitable fabrication techniques such as spin-on coating, chemical vapor deposition (CVD), plasma-enhanced chemical vapor deposition (PECVD) or the like. In some embodiments, the material of the passivation layer 122 may be different from the material of the topmost dielectric layer 104 of the redistribution layer structure RDL1 shown in FIG. 1F. For example, the topmost dielectric layer 104 may be made of molding compound, and the passivation layer 122 may be made of polymer such as polyimide. However, the disclosure is not limited thereto. In some alternative embodiments, the topmost dielectric layer 104 and the passivation layer 122 may be made of the same material. In some embodiments, the conductive patterns 124 are used as conductive terminals, which may include a plurality of conductive pillars and a plurality of under-ball metallurgy (UBM) patterns therebeneath for ball mount.

After forming the conductive patterns 124 in the passivation layer 122, the bonding elements 126 are formed on and electrically connected to the conductive patterns 124. In some embodiments, the bonding elements 126 may be solder regions such as micro-bumps or the like. The bonding elements 126 are electrically connected to the redistribution layer structure RDL1 through the conductive patterns 124.

In some embodiments, the bonding elements 126 may be formed by a mounting process and a reflow process. In some embodiments, a diameter of the bonding element 126 is smaller than a diameter of the bonding elements 108. In some embodiments, the pitch between the bonding elements 126 may be 20 µm to 80 µm, and the diameter of the bonding elements 126 may be between 10 µm to 25 µm. During the formation of the conductive patterns 124 and the bonding elements 126, the outermost conductive patterns 115B of the circuit board structure CBS may be protected from being damaged. In some embodiments, the conductive patterns 124 and the bonding elements 126 may be collectively referred to as connectors CN. As illustrated in FIG. 1F, each connector CN is partially embedded in the passivation layer 122. For example, each of the conductive patterns 124 is partially embedded in the passivation layer 122.

Figure 1G:
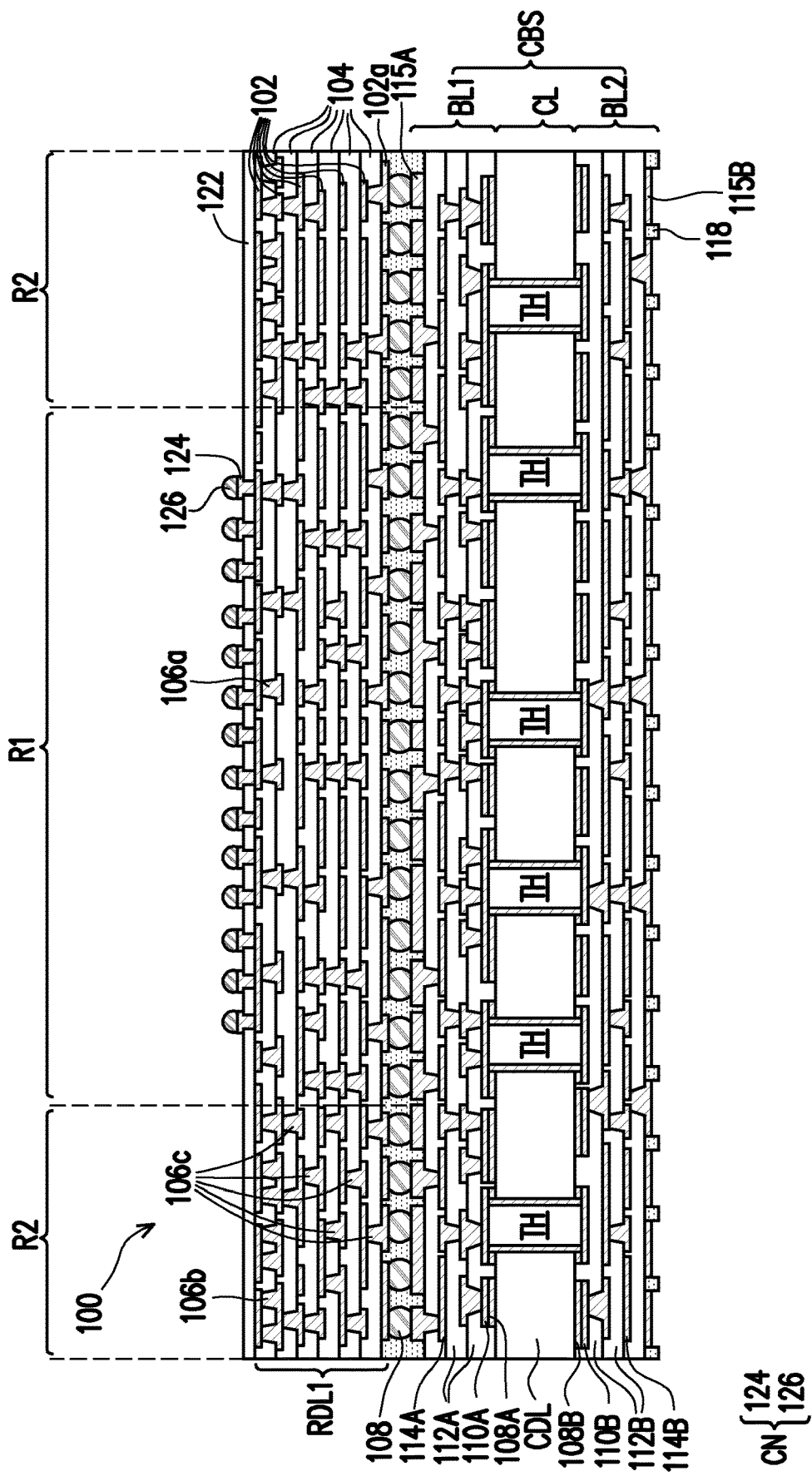

Referring to FIG. 1F and FIG. 1G, a dicing process is performed on the structure illustrated in FIG. 1F along a cutting line to render individual and separated integrated substrates 100, as shown in FIG. 1G. In some embodiments, the cutting line is substantially an extension line of a sidewall of the circuit board structure CBS. In some embodiments, the dicing process is a wafer dicing process including mechanical blade sawing or laser cutting. In some embodiments, the integrated substrate 100 may include the circuit board structure CBS (i.e., a semi-finished circuit substrate), the redistribution layer structure RDL1, the passivation layer 122, the connectors CN, the insulating patterns 118, and the bonding elements 108. In some embodiments, the integrated substrate 100 has a high modulus such as in a range of 15 GPa to 50 GPa.

Figure 1H:
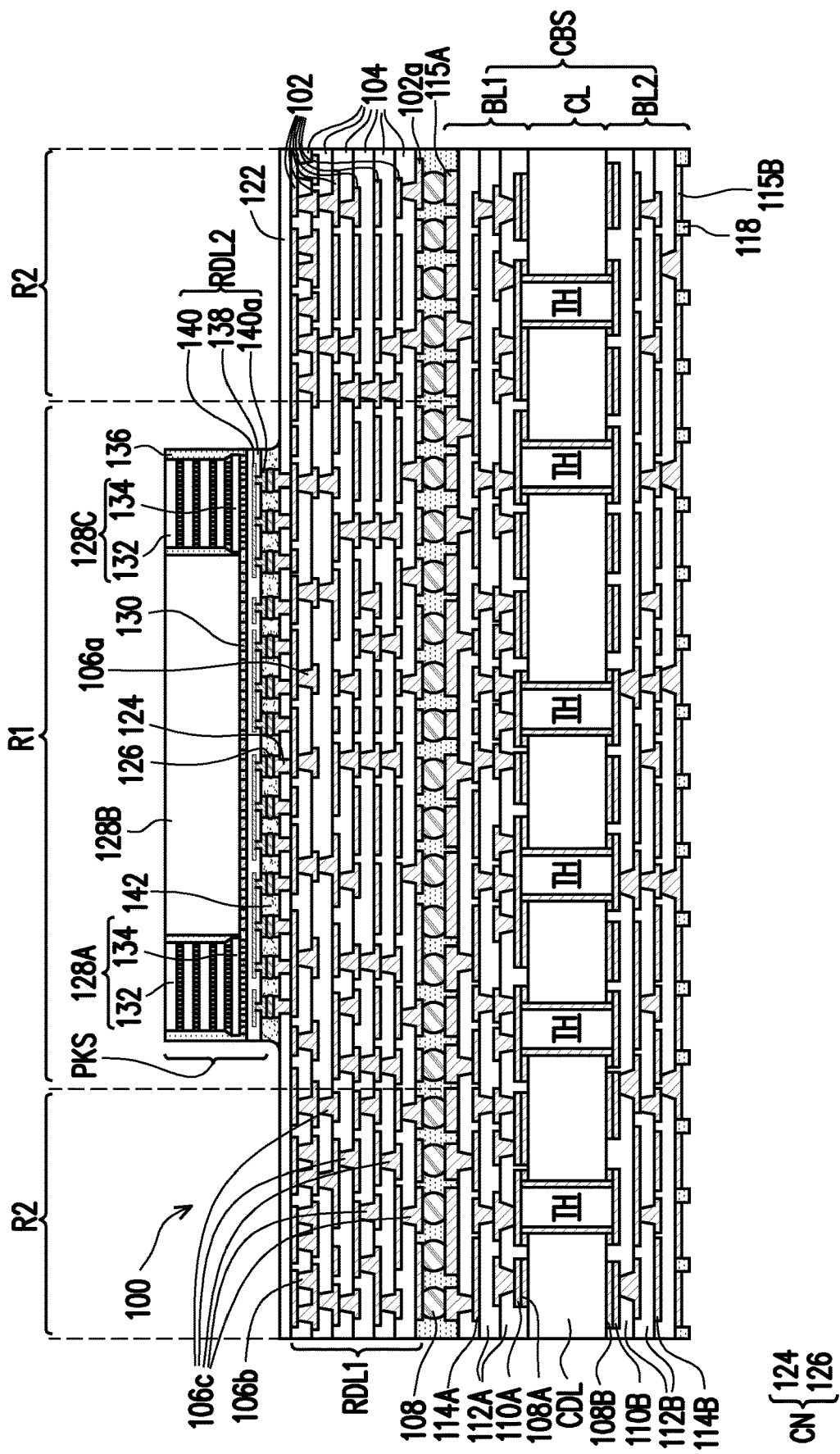

Referring to FIG. 1H, a package structure PKS is bonded to the integrated substrate 100 through the connectors CN. For example, the package structure PKS is bonded onto the first region R1 of the redistribution layer structure RDL1. In some embodiments, the package structure PKS is electrically connected to the redistribution layer structure RDL1 through the connectors CN. In some embodiments, the package structure PKS may include System-On-Chip (SoC) packages, Chip-On-Wafer (CoW) packages, Integrated-Fan-Out (InFO) packages, Chip-On-Wafer-On-Substrate (CoWoS) packages, other three-dimensional integrated circuit (3DIC) packages, and/or the like. In some embodiments, the package structure PKS includes a plurality of package components 128A, 128B, and 128C with a plurality of connectors 130 thereon, an encapsulant 136 encapsulating the package components 128A, 128B, and 128C, and a redistribution layer structure RDL2 over the encapsulant 136.

In some embodiments, each of the package components 128A, 128B, and 128C may be a package, a device die, a die stack, and/or the like. The device die may be high performance integrated circuit, such as a System-on-Chip (SoC) die, a Central Processing Unit (CPU) die, a Graphic Processing Unit (GPU) die, field-programmable gate array (FPGA) die, a mobile application die, a memory die, or a die stack. In some embodiments, the memory die may be in the form of memory cube such as High Bandwidth Memory (HBM) cube. The package components 128A, 128B, and 128C may have the respective semiconductor substrates (not shown) in the respective dies. In some embodiments, a rear surface of the semiconductor substrates is a surface that faces upward in accordance to the orientation illustrated in FIG. 1H. The package components 128A, 128B, and 128C further include integrated circuit devices (such as active devices, which include transistors; not shown) at a front surface (e.g., a surface facing downward) of the respective semiconductor substrates. In some embodiments, the package components 128A, 128B, and 128C may have the same or different sizes and/or functions upon the design requirements. In some embodiments, the package components 128A, 128C may be memory cubes, and the package component 128B may be CPU, GPU, FPGA, or other suitable high performance integrated circuit. In some embodiments, the package component 128A, 128C may respectively include a die stack 132 and a controller 134 at the bottom of the die stack 132.

As illustrated in FIG. 1H, the connectors 130 of package components 128A, 128B, and 128C are encapsulated in the encapsulant 136. However, the disclosure is not limited thereto. In some alternative embodiments, the connectors 130 may be disposed in a dielectric layer (not shown) which is then encapsulated by the encapsulant 136. In some embodiments, the redistribution layer structure RDL2 is disposed over the package components 128A, 128B, and 128C and the encapsulant 136. In some embodiments, the redistribution layer structure RDL2 is electrically connected to the package components 128A, 128B, and 128C. In some embodiments, the redistribution layer structure RDL2 may be a fan-out redistribution layer structure. The redistribution layer structure RDL2 may include a plurality of dielectric layers 138 and a plurality of conductive patterns 140, 140a, and the dielectric layers 138 and the conductive patterns 140, 140a are alternately stacked over the package components 128A, 128B, and 128C. In some embodiments, the conductive patterns 140a are used as conductive terminals, which may include a plurality of conductive pillars and a plurality of under-ball metallurgy (UBM) patterns therebeneath for ball mount. In some embodiments, after bonding, an underfill 142 may be dispensed to protect the bonding structure between the package structure PKS and the circuit board structure CBS. In some embodiments, a total thickness from a bottom of the underfill 142 to a top of the package structure PKS may be in a range of 50 µm to 1500 µm. In some embodiments, the package structure PKS is pre-fabricated. For example, the package components 128A, 128B, and 128C are encapsulated by the encapsulant 136 before bonding to the integrated substrate 100. However, the disclosure is not limited thereto. In some alternative embodiments, the package components 128A, 128B, and 128C may be bonded to the integrated substrate 100, and then the encapsulant 136 is formed over the integrated substrate 100 to encapsulate the package components 128A, 128B, and 128C.

Figure 1I:
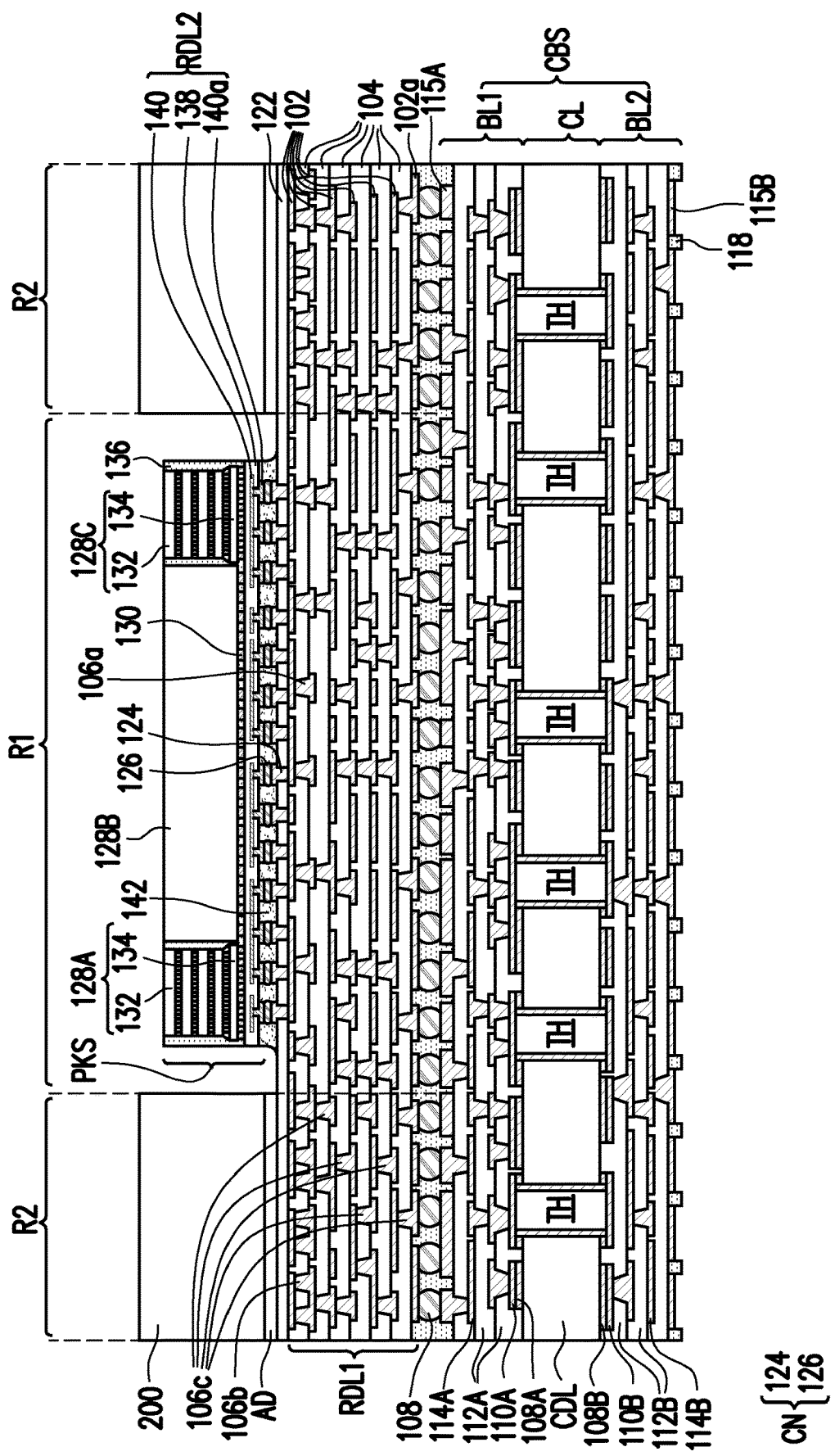

Referring to FIG. 1I, an adhesive layer AD and a ring structure 200 are sequentially formed over the second region R2 of the redistribution layer structure RDL1. For example, the ring structure 200 is attached to the passivation layer 122 through the adhesive layer AD. In some embodiments, a material of the adhesive layer AD includes a thermally curable polymer. In some embodiments, a vertical projection of the adhesive layer AD onto the redistribution layer structure RDL1 is completely overlapped with the second region R2 of the redistribution layer structure RDL1. That is, sidewalls of the adhesive layer AD are substantially aligned with the boundary of the second region R2, and a contour of the adhesive layer AD corresponds to a contour of the second region R2. For example, the adhesive layer AD exhibits a ring shape from a top view. In some embodiments, the ring structure 200 is made of conductive materials. For example, the ring structure 200 may be made of aluminum, titanium, copper, nickel, tungsten, and/or alloys thereof. However, the disclosure is not limited thereto. In some alternative embodiments, the ring structure 200 may be made of other materials having sufficient rigidity. In some embodiments, a vertical projection of the ring structure 200 onto the redistribution layer structure RDL1 is completely overlapped with the second region R2 of the redistribution layer structure RDL1. That is, sidewalls of the ring structure 200 are substantially aligned with the boundary of the second region R2, and a contour of the ring structure 200 corresponds to a contour of the second region R2. For example, the ring structure 200 exhibits a ring shape from a top view. In some embodiments, the ring structure 200 is able to control the warpage of the subsequently formed semiconductor package 10. That is, with the presence of the ring structure 200, the warpage issue derived from the manufacturing process of the semiconductor package 10 may be sufficiently alleviated.

In some cases, due to coefficient of thermal expansion (CTE) mismatch between the ring structure 200 and the redistribution layer structure RDL1/the circuit board structure CBS, delamination between the topmost conductive patterns 102 and the topmost dielectric layer 104 shown in FIG. 1I may occur directly underneath the ring structure 200. However, as mentioned above and as shown in FIGS. 2A-2B, the pattern density of the conductive vias 106b embedded in the topmost dielectric layer 104 (i.e. the dielectric layer 104 of the redistribution layer structure RDL1 closest to the package structure PKS and the ring structure 200) is greater than the pattern density of the conductive vias 106a embedded in the topmost dielectric layer 104. Since the conductive vias 106b are located in the second region R2 of the redistribution layer structure RDL1, the denser conductive vias 106b directly underneath the ring structure 200 are able to serve as reinforcement structures to enhance the attachment between the topmost conductive patterns 102 and the topmost dielectric layer 104. That is, with the presence of the denser conductive vias 106b as shown in FIGS. 2A-2B, the stress between the topmost conductive patterns 102 and the topmost dielectric layer 104 shown in FIG. 1I may be sufficiently reduced. For example, the stress between the topmost conductive patterns 102 and the topmost dielectric layer 104 may be reduced by approximately 7%. As a result, the delamination between the topmost conductive patterns 102 and the topmost dielectric layer 104 derived from CTE mismatch between the ring structure 200 and the redistribution layer structure RDL1/the circuit board structure CBS may be sufficiently alleviated. In some alternative embodiments, as shown in FIG. 1I and FIGS. 2C-2F, wall structures 106d are embedded in the topmost dielectric layer 104 (i.e. the dielectric layer 104 of the redistribution layer structure RDL1 closest to the package structure PKS and the ring structure 200). Since the wall structures 106d are located in the second region R2 of the redistribution layer structure RDL1, the wall structures 106d directly underneath the ring structure 200 are able to serve as reinforcement structures to enhance the attachment between the topmost conductive patterns 102 and the topmost dielectric layer 104. That is, with the presence of the wall structures 106d as shown in FIGS. 2C-2F, the stress between the topmost conductive patterns 102 and the topmost dielectric layer 104 shown in FIG. 1I may be sufficiently reduced. For example, the stress between the topmost conductive patterns 102 and the topmost dielectric layer 104 may be reduced by approximately 15%. As a result, the delamination between the topmost conductive patterns 102 and the topmost dielectric layer 104 derived from CTE mismatch between the ring structure 200 and the redistribution layer structure RDL1/the circuit board structure CBS may be sufficiently alleviated.

Figure 1J:
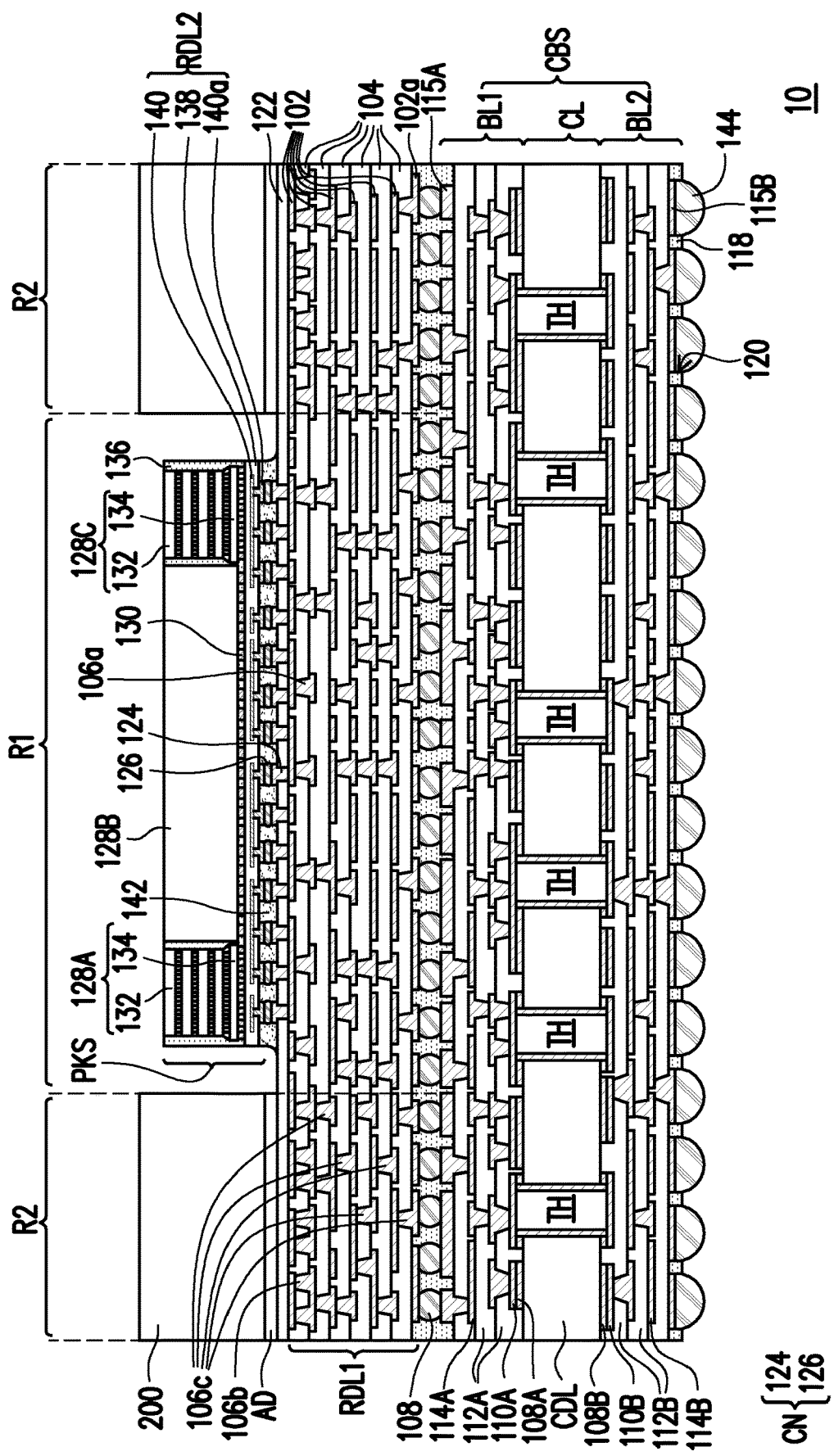

Referring to FIG. 1J, after the ring structure 200 is formed, a plurality of conductive terminals 144 is formed in the openings 120 exposing the outermost conductive pattern 115B of the second build-up layer BL2. The conductive terminals 144 are electrically connected to the outermost conductive patterns 115B in the second build-up layer BL2 of the circuit board structure CBS. In some embodiments, the conductive terminals 144 may be ball grid array (BGA) connectors, solder balls, metal pillars, and/or the like. In some embodiments, a pitch of the conductive terminals 144 may be in a range from 500 μm to 1500 μm. In some embodiments, the conductive terminals 144 may be formed by a mounting process and a reflow process. As shown in FIG. 1J, the openings 120 are filled with the conductive terminals 144 and the top surfaces of the insulating patterns 118 are not covered by the conductive terminals 144. However, the disclosure is not limited thereto. In some alternative embodiments, the top surfaces of the insulating patterns 118 may be partially covered by the conductive terminals 144 while the conductive terminals 144 are separated from each other. Alternatively, the conductive terminals 144 do not fully cover the outermost conductive patterns 115B, and a gap may be formed between the conductive terminal 144 and the insulating pattern 118. In some embodiments, the conductive terminals 144 are available to be mounted onto additional electrical components (e.g., circuit carrier, system board, mother board, etc.).

At this point, the semiconductor package 10 is fabricated. In some embodiments, the semiconductor package 10 may have a super large size of 70 mm×70 mm, 100 mm×100 mm, or larger.

Figure 3:
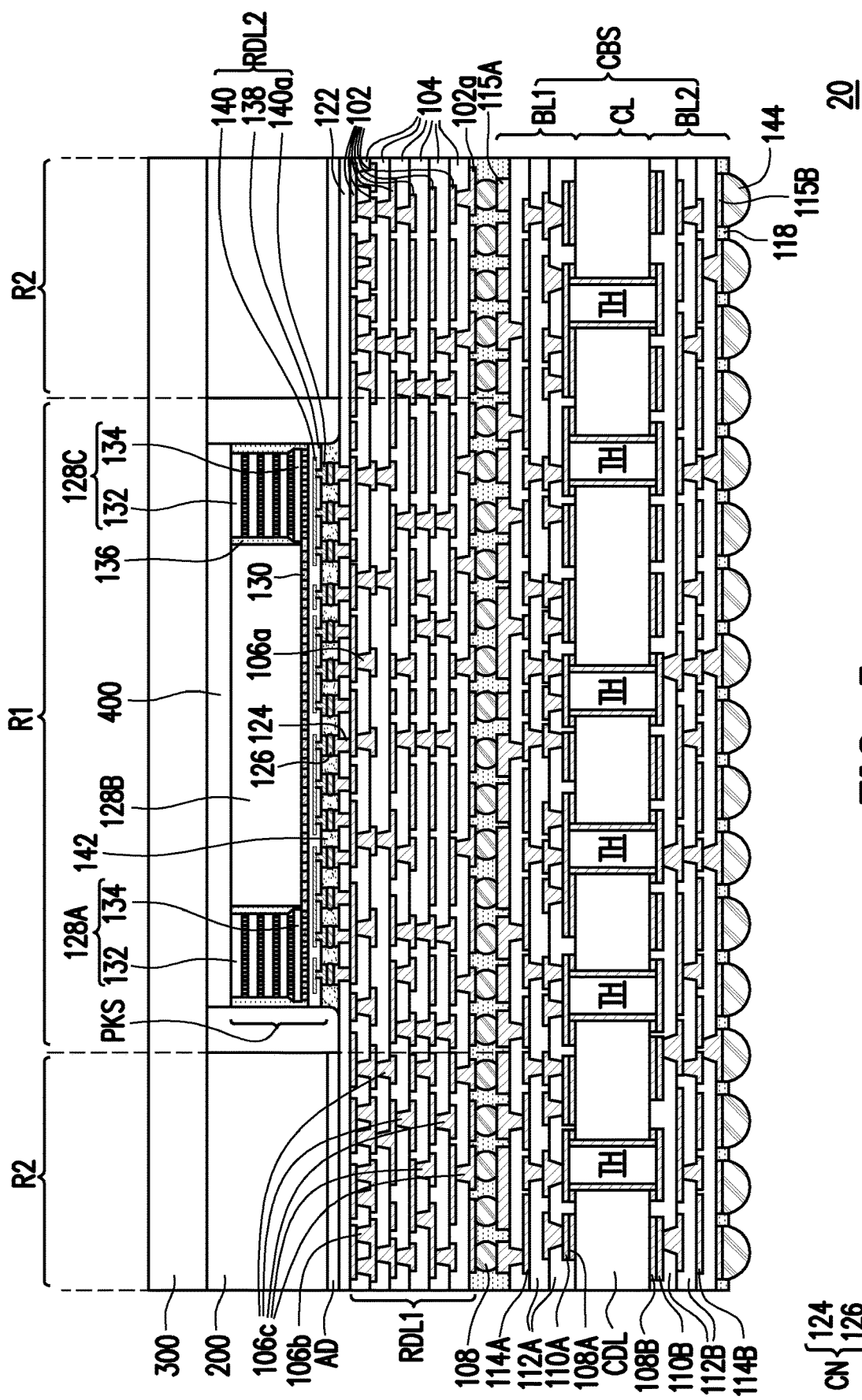
FIG. 3 is a schematic cross-sectional view illustrating a semiconductor package in accordance with some alternative embodiments of the disclosure.

FIG. 3 is a schematic cross-sectional view illustrating a semiconductor package 20 in accordance with some alternative embodiments of the disclosure. Referring to FIG. 3, the semiconductor package 20 in FIG. 3 is similar to the semiconductor package 10 in FIG. 1J, so similar elements are denoted by the same reference numeral, and the detailed descriptions thereof are omitted herein. The difference between the semiconductor package 20 in FIG. 3 and the semiconductor package 10 in FIG. 1J lies in that the semiconductor package 20 further includes a lid 300 disposed over the ring structure 200 and the package structure PKS. In addition, a thermal dissipation layer 400 is formed between the package structure PKS and the lid 300. In some embodiments, a material of the lid 300 may be the same as the material of the ring structure 200. For example, the lid 300 may be made of aluminum, titanium, copper, nickel, tungsten, and/or alloys thereof. However, the disclosure is not limited thereto. In some alternative embodiments, the material of the lid 300 may be different from the material of the ring structure 200. In some embodiments, the ring structure 200 and the lid 300 enclose the package structure PKS, so as to protect the package structure PKS.

In some embodiments, the thermal dissipation layer 400 may include a thermal interface material (TIM). In some embodiments, the TIM is an adhesive material. In some embodiments, the TIM includes grease-based materials, phase change materials, gels, adhesives, polymeric, metallic materials, or a combination thereof. In some embodiments, the TIM includes lead-tin based solder (PbSn), silver paste (Ag), gold, tin, gallium, indium, or other suitable thermally conductive materials. Depending on the type of material used, the TIM may be formed by deposition, lamination, printing, plating, or any other suitable technique. In some embodiments, the TIM is a gel type material. In some embodiments, the TIM is a film type material (e.g., carbon nanotubes or graphite). In some embodiments, the lid 300 is attached to the package structure PKS through the thermal dissipation layer 400.

Figure 4:
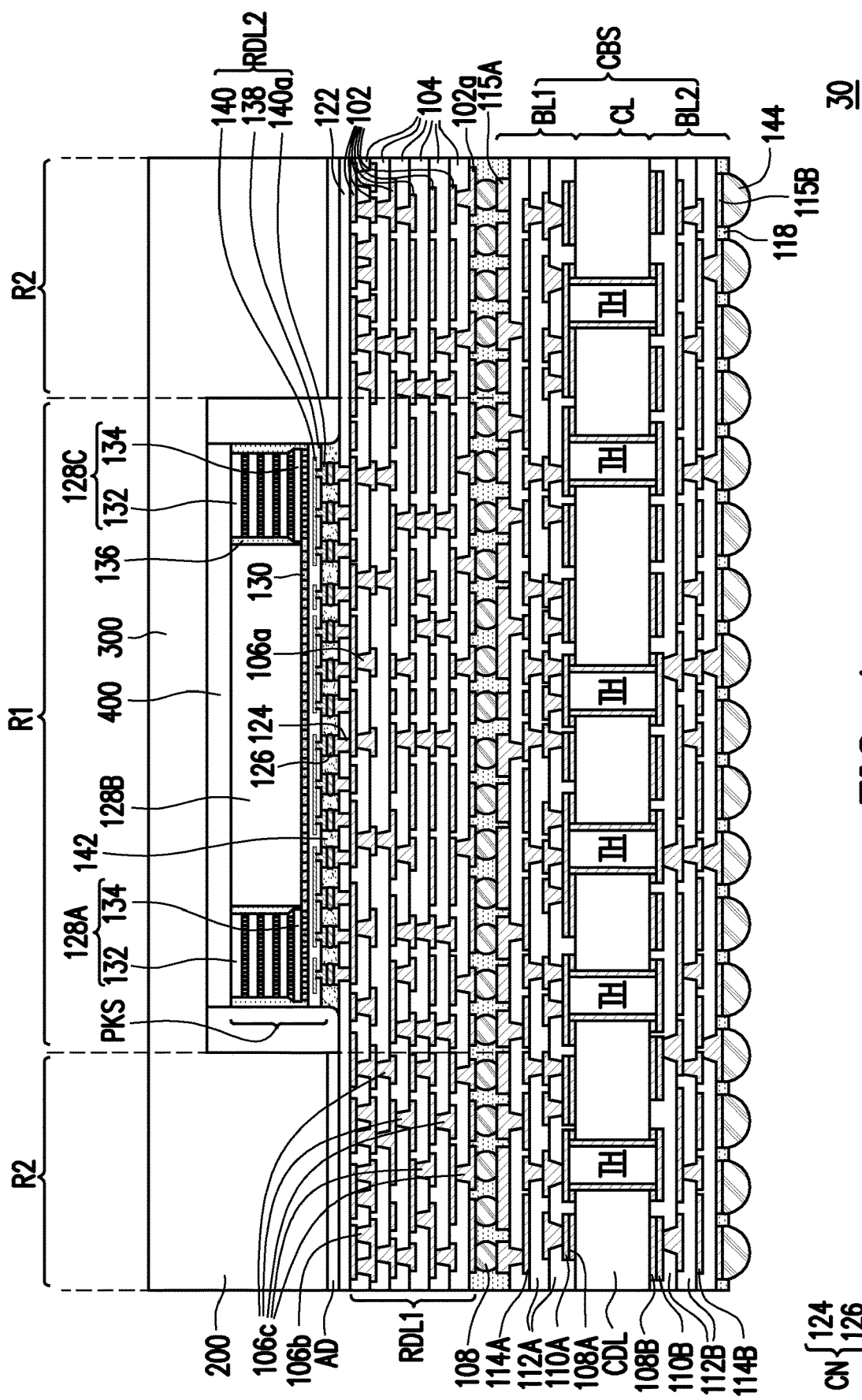
FIG. 4 is a schematic cross-sectional view illustrating a semiconductor package in accordance with some alternative embodiments of the disclosure.

FIG. 4 is a schematic cross-sectional view illustrating a semiconductor package 30 in accordance with some alternative embodiments of the disclosure. Referring to FIG. 4, the semiconductor package 30 in FIG. 4 is similar to the semiconductor package 20 in FIG. 3, so similar elements are denoted by the same reference numeral, and the detailed descriptions thereof are omitted herein. The difference between the semiconductor package 30 in FIG. 4 and the semiconductor package 20 in FIG. 3 lies in that the ring structure 200 and the lid 300 are integrally formed in the semiconductor package 30. In other words, no interface is seen between the ring structure 200 and the lid 300. In some embodiments, the integrally formed ring structure 200 and lid 300 enclose the package structure PKS, so as to protect the package structure PKS.

In accordance with some embodiments of the disclosure, a semiconductor package includes a circuit board structure, a redistribution layer structure, a package structure, and a ring structure. The redistribution layer structure has a first region and a second region surrounding the first region. The redistribution layer structure is disposed over and electrically connected to the circuit board structure. A metal density in the second region is greater than a metal density in the first region. The package structure is disposed over the first region of the redistribution layer structure. The package structure is electrically connected to the redistribution layer structure. The ring structure is disposed over the second region of the redistribution layer structure.

In accordance with some alternative embodiments of the disclosure, a semiconductor package includes a circuit board structure, a redistribution layer structure, a package structure, and a ring structure. The redistribution layer structure has a first region and a second region surrounding the first region. The redistribution layer structure is disposed over and electrically connected to the circuit board structure. The redistribution layer structure includes conductive vias and wall structures located at the same level height. The conductive vias are located in the first region and the second region. The wall structures are located in the second region. The package structure is disposed over the first region of the redistribution layer structure. The package structure is electrically connected to the redistribution layer structure. The ring structure is disposed over the second region of the redistribution layer structure.

In accordance with some embodiments of the disclosure, a manufacturing method of a semiconductor package includes at least the following steps. A redistribution layer structure is formed. The redistribution layer structure has a first region and a second region surrounding the first region. A metal density in the second region is greater than a metal density in the first region. A circuit board structure is bonded onto the redistribution layer structure. The circuit board structure is encapsulated by an encapsulant. A package structure is bonded onto the first region of the redistribution layer structure opposite to the circuit board structure. A ring structure is formed over the second region of the redistribution layer structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a circuit board structure;
a redistribution layer structure having a first region and a second region surrounding the first region, wherein the redistribution layer structure is disposed over and electrically connected to the circuit board structure, and a metal density in the second region is greater than a metal density in the first region;
a package structure disposed over the first region of the redistribution layer structure, wherein the package structure is electrically connected to the redistribution layer structure, the package structure comprises an integrated circuit device, and the package structure is completely located in the first region; and
a ring structure disposed over the second region of the redistribution layer structure, wherein a top surface of the ring structure is located at a level height higher than that of a top surface of the package structure.

2. The semiconductor package of claim 1, further comprising:
a passivation layer disposed on the redistribution layer structure;
connectors partially embedded in the passivation layer, wherein the package structure is electrically connected to the redistribution layer structure through the connectors.

3. The semiconductor package of claim 2, wherein the redistribution layer structure comprises dielectric layers, first conductive vias, and second conductive vias, the first conductive vias and the second conductive vias are embedded in the dielectric layer closest to the package structure and the ring structure, the first conductive vias are located in the first region and the second conductive vias are located in the second region, and a pattern density of the second conductive vias is greater than a pattern density of the first conductive vias.

4. The semiconductor package of claim 3, wherein a ratio of the pattern density of the second conductive vias to the pattern density of the first conductive vias ranges from about 6:1 to about 19:1.

5. The semiconductor package of claim 3, wherein the second region comprises first sub-regions and a second sub-region located between two adjacent first sub-regions, a size of each of the first sub-regions is equal to a size of the second sub-region, each of the first sub-regions comprises at least one second conductive via, the second sub-region comprises at least one second conductive via, and a pattern density of the second conductive vias located in the second sub-region is larger than a pattern density of the second conductive vias located in the first sub-regions.

6. The semiconductor package of claim 5, wherein the pattern density of the second conductive vias located in the first sub-region is less than or greater than the pattern density of the first conductive vias located in the first region.

7. The semiconductor package of claim 5, wherein the pattern density of the second conductive vias located in the first sub-region is equal to the pattern density of the first conductive vias located in the first region.

8. The semiconductor package of claim 3, wherein the second conductive vias are electrically floating.

9. The semiconductor package of claim 1, further comprising a lid disposed over the ring structure and the package structure.

10. The semiconductor package of claim 9, wherein the lid and the ring structure are integrally formed.

11. A semiconductor package, comprising:
a circuit board structure;
a redistribution layer structure having a first region and a second region surrounding the first region, wherein the redistribution layer structure is disposed over and electrically connected to the circuit board structure, the redistribution layer structure comprises conductive vias and wall structures located at the same level height, the conductive vias are located in the first region and the second region, and the wall structures are located in the second region;
a package structure disposed over the first region of the redistribution layer structure, wherein the package structure is electrically connected to the redistribution layer structure, the package structure comprises an integrated circuit device, and the package structure is completely located in the first region; and
a ring structure disposed over the second region of the redistribution layer structure, wherein the wall structures are spatially separated from the ring structure.

12. The semiconductor package of claim 11, wherein a metal density in the second region is greater than a metal density in the first region.

13. The semiconductor package of claim 11, wherein the redistribution layer structure further comprises dielectric layers, and the wall structures are embedded in the dielectric layer closest to the package structure and the ring structure.

14. The semiconductor package of claim 11, wherein the wall structures extend from the second region to the first region.

15. The semiconductor package of claim 11, wherein the wall structures extend radially outward.

16. The semiconductor package of claim 11, further comprising a lid disposed over the ring structure and the package structure.

17. A manufacturing method of a semiconductor package, comprising:
forming a redistribution layer structure, wherein the redistribution layer structure has a first region and a second region surrounding the first region, and a metal density in the second region is greater than a metal density in the first region;
bonding a circuit board structure onto the redistribution layer structure such that the redistribution layer structure is electrically connected to the circuit board structure;
encapsulating the circuit board structure by an encapsulant;
bonding a package structure onto the first region of the redistribution layer structure opposite to the circuit board structure such that the package structure is electrically connected to the redistribution layer structure, wherein the package structure comprises an integrated circuit device, and the package structure is completely located in the first region; and
forming a ring structure over the second region of the redistribution layer structure, wherein a top surface of the ring structure is located at a level height higher than that of a top surface of the package structure.

18. The method of claim 17, wherein forming the redistribution layer structure comprises:
forming conductive patterns;

forming a dielectric layer to cover the conductive patterns; and forming first conductive vias and second conductive vias embedded in the dielectric layer, the first conductive vias are located in the first region and the second conductive vias are located in the second region, and a pattern density of the second conductive vias is greater than a pattern density of the first conductive vias.

19. The method of claim 17, wherein forming the redistribution layer structure comprises:

forming conductive patterns;

forming a dielectric layer to cover the conductive patterns; and forming conductive vias and wall structures embedded in the dielectric layer, the conductive vias are located in the first region and the second region, and the wall structures are located in the second region.

20. The method of claim 17, further comprising:

forming a lid over the ring structure and the package structure.

* * * * *